(12) United States Patent
Morales et al.

(10) Patent No.: US 11,137,563 B2
(45) Date of Patent: Oct. 5, 2021

(54) FLEXIBLE DATA CENTER INFRASTRUCTURE DISTRIBUTION

(71) Applicant: Amazon Technologies, Inc., Seattle, WA (US)

(72) Inventors: Osvaldo P. Morales, Seattle, WA (US); Brock Robert Gardner, Seattle, WA (US)

(73) Assignee: Amazon Technologies, Inc., Seattle, WA (US)

(*) Notice: Subject to any disclaimer, the term of this patent is extended or adjusted under 35 U.S.C. 154(b) by 0 days.

(21) Appl. No.: 16/706,532

(22) Filed: Dec. 6, 2019

(65) Prior Publication Data

US 2020/0116966 A1 Apr. 16, 2020

Related U.S. Application Data

(63) Continuation of application No. 16/112,501, filed on Aug. 24, 2018, now Pat. No. 10,502,918, which is a (Continued)

(51) Int. Cl.
*G02B 6/44* (2006.01)
*H05K 7/14* (2006.01)
(Continued)

(52) U.S. Cl.
CPC ......... *G02B 6/4452* (2013.01); *G02B 6/4479* (2013.01); *G06F 1/16* (2013.01);
(Continued)

(58) Field of Classification Search
None
See application file for complete search history.

(56) References Cited

U.S. PATENT DOCUMENTS 9,760,098 B1 9/2017 Imwalle et al.
10,502,918 B1 12/2019 Morales et al.
(Continued)

OTHER PUBLICATIONS

Search Report from Singapore Patent Application No. 11201609065W, dated Dec. 17, 2017, pp. 1-2.
(Continued)

*Primary Examiner* — Syed A Roni
(74) *Attorney, Agent, or Firm* — Robert C. Kowert; Kowert, Hood, Munyon, Rankin & Goetzel, P.C.

(57) ABSTRACT

A data center includes various sets of infrastructure modules which each provide a particular type of infrastructure support to support computing operations in the data center. Separate sets of infrastructure modules can be installed incrementally based on incrementally changing support capacity for the corresponding type of infrastructure support in the data center. Such incrementally changing support capacity can be based upon support requirements of electrical loads, including rack computer systems, which are inbound to the data center. Where support capacity for a particular type of infrastructure support drops below a threshold, a quantity of additional infrastructure modules which provide the particular type of infrastructure support can be selected and installed to increase the support capacity. Separate sets of infrastructure modules can be selected and installed independently of each other, to independently adjust support capacity for separate types of infrastructure support, which can minimize excess support capacity at any given time.

20 Claims, 8 Drawing Sheets

Related U.S. Application Data continuation of application No. 14/475,189, filed on Sep. 2, 2014, now Pat. No. 10,061,097.

(60) Provisional application No. 61/987,453, filed on May 1, 2014.

(51) Int. Cl.
*H05K 7/20* (2006.01)
*H04L 12/24* (2006.01)
*G06F 1/16* (2006.01)
*H05K 7/18* (2006.01)

(52) U.S. Cl.
CPC ......... *H04L 41/145* (2013.01); *H05K 7/1485* (2013.01); *H05K 7/1487* (2013.01); *H05K 7/1491* (2013.01); *H05K 7/1492* (2013.01); *H05K 7/1494* (2013.01); *H05K 7/1498* (2013.01); *H05K 7/18* (2013.01); *H05K 7/20709* (2013.01); *H05K 7/20736* (2013.01); *H05K 7/1497* (2013.01); *Y10T 29/49119* (2015.01)

(56) References Cited

U.S. PATENT DOCUMENTS

| | | |
|---|---|---|
| 2005/0241802 A1 | 11/2005 | Malone et al. |
| 2008/0144375 A1 | 6/2008 | Cheng |
| 2009/0138313 A1 | 5/2009 | Morgan et al. |
| 2009/0296342 A1 | 12/2009 | Matteson et al. |
| 2011/0213735 A1 | 9/2011 | Cao et al. |
| 2013/0190899 A1 | 7/2013 | Slessman et al. |
| 2013/0232888 A1 | 9/2013 | Crosby, Jr. |
| 2013/0233532 A1 | 9/2013 | Imwalle et al. |
| 2014/0059945 A1 | 3/2014 | Gardner et al. |

OTHER PUBLICATIONS

Written Opinion from Singapore Patent Application No. 11201609065W, dated Dec. 19, 2017, pp. 1-6.
International Search Report and Written Opinion in PCT/US/028809, dated Jun. 30, 2015, Amazon Technologies, Inc., pp. 1-13.
Dave Cole, "The Information Source for the Data Center Industry Data Center Knowledge Guide to Data Center Infrastructure Management (DCIM) Data Center Knowledge Guide to DCIM", May 2012, Downloaded from https://connect.ufl.edu/cns/DCO/dcim/White%20Papers/1_19292_DCK_Guide_to_DCIM_Final.pdf, pp. 1-19.
"Curse You, UCS", Douglas Alger, Cisco Blogs, Jun. 1, 2011, pp. 1-3.
"Design for a Productive Data Center", Douglas Alger, Cisco, May 2007, pp. 1-2.
"Designing a Scalable Network Infrastructure", Dr. Natheer Khasawneh, Rafat A. Dasan, downloaded Apr. 28, 2014, pp. 1-31.
Notice of the Reason for Refusal from JP Patent Application No. 2017-510451, dated Sep. 12, 2017, English Translation included, pp. 1-10.
Office Action from European Application No. 15722855.2-1221, (Amazon Technologies, Inc.), dated Jan. 18, 2019, pp. 1-12.

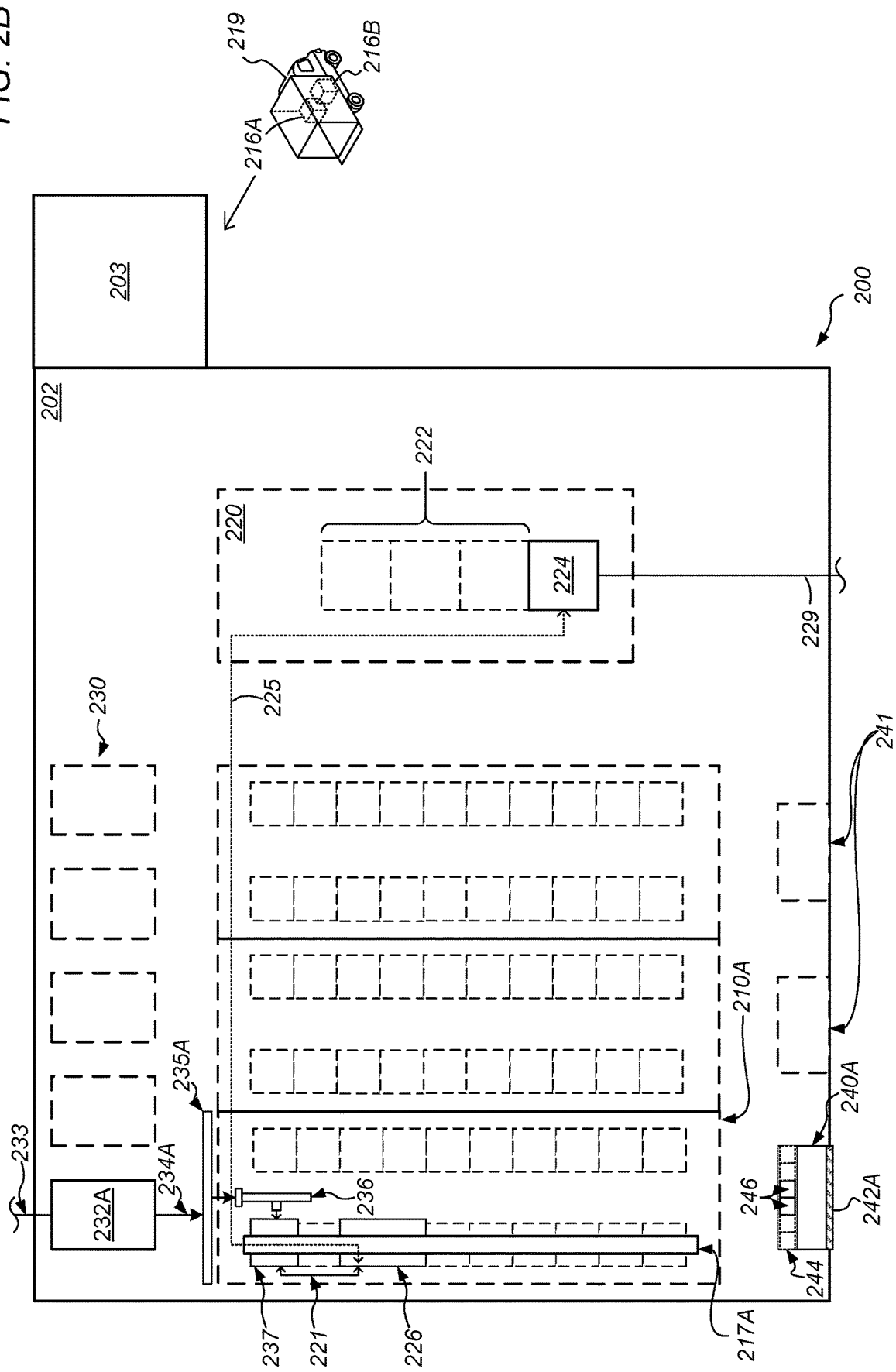

FLEXIBLE DATA CENTER INFRASTRUCTURE DISTRIBUTION

PRIORITY INFORMATION

This application is a continuation of U.S. patent application Ser. No. 16/112,501, filed Aug. 24, 2018, which is a continuation of U.S. patent application Ser. No. 14/475,189, filed Sep. 2, 2014, now U.S. Pat. No. 10,061,097, which are hereby incorporated by reference herein in their entirety.

BACKGROUND

Organizations such as on-line retailers, Internet service providers, search providers, financial institutions, universities, and other computing-intensive organizations often conduct computer operations from large scale computing facilities. Such computing facilities house and accommodate a large amount of server, network, and computer equipment to process, store, and exchange data as needed to carry out an organization's operations. Typically, a computer room of a computing facility includes many server racks. Each server rack, in turn, includes many servers and associated computer equipment.

Because a computing facility may contain a large number of servers, a large amount of electrical power may be required to operate the facility. In addition, the electrical power is distributed to a large number of locations spread throughout the computer room (e.g., many racks spaced from one another, and many servers in each rack). Usually, a facility receives a power feed at a relatively high voltage. This power feed is stepped down to a lower voltage (e.g., 110V). A network of cabling, bus bars, power connectors, and power distribution units, is used to deliver the power at the lower voltage to numerous specific components in the facility.

Because a computing facility may contain a large number of servers, a large amount of infrastructure may be required to support computing capacity of the data center. In particular, a large amount of cabling infrastructure equipment, electrical distribution infrastructure equipment, network communication infrastructure equipment, air cooling infrastructure equipment, etc. may be required to support computing operations by servers in a data center at any given time. Some instances of infrastructure are usually installed at initial construction of a data center, based at least in part upon design assumptions regarding the support requirements of server racks (also referred to herein as "rack computer systems") that are expected to be installed in the data center.

In some cases, where some or all infrastructure initially installed in a data center is based on expected support requirements of server racks which are expected to be installed in the data center, the server racks which are actually installed in a data center may differ in support requirements from the server racks upon which the infrastructure for a data center is originally designed. In addition, the support requirements of installed server racks may vary from rack to rack. Infrastructure which is designed based on expected support requirements of installed server racks may be at least partially restricted in supporting server racks that are actually installed.

The amount of computing capacity needed for any given data center may change rapidly as business needs dictate. Most often, there is a need for increased computing capacity at a location. Initially providing computing capacity in a data center, or expanding the existing capacity of a data center (in the form of additional servers, for example), is resource-intensive and may take many months to implement. Substantial time and resources are typically required to design and build a data center (or expansion thereof), install cabling infrastructure, install racks, structural support infrastructure, electrical distribution infrastructure, and cooling infrastructure, etc., to support changes in computing capacity. Additional time and resources are typically needed to conduct inspections and obtain certifications and approvals, such as for electrical and HVAC systems. Changes in computing capacity may result in changes in infrastructure support required to support the changed computing capacity. Installing infrastructure equipment, modifying infrastructure equipment, etc. may be time consuming and expensive, if even feasible. For example, where an installed server rack in a portion of a data center is replaced with another server rack, where the new server rack has substantially greater infrastructure support requirements, modifying the infrastructure which supported the previously-installed server rack may be difficult, particularly where the infrastructure to be modified lacks sufficient excess capacity to provide the needed support to the newly-installed server rack.

BRIEF DESCRIPTION OF THE DRAWINGS

FIG. 2A-D are schematic diagrams illustrating a data center in which rack computer systems and various infrastructure modules are incrementally installed, according to some embodiments.

Figure 1:
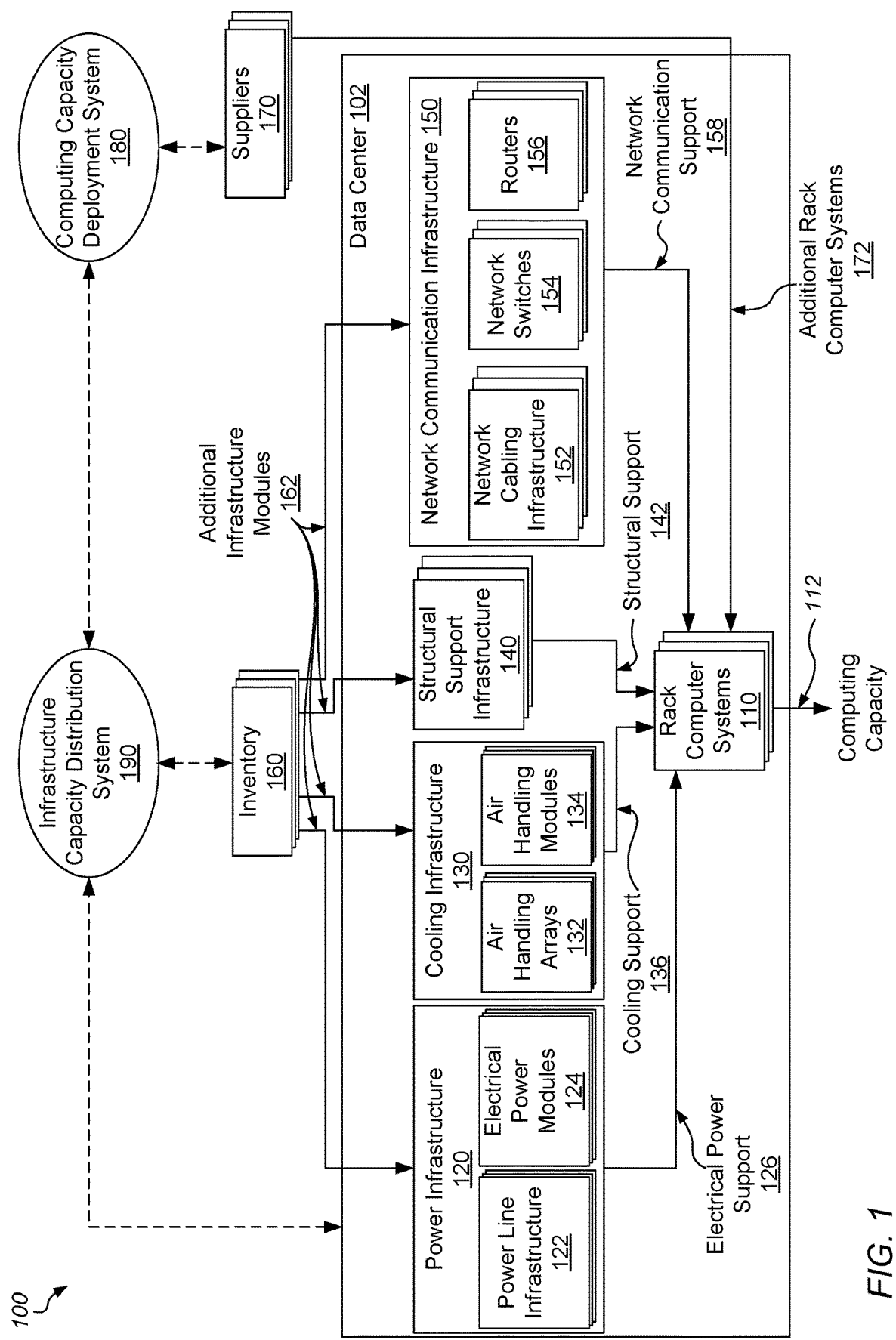
FIG. 1 is a schematic diagram illustrating a data center in which various infrastructure modules are selected and installed in a data center to provide various types of infrastructure support to installed rack computer systems in the data center.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a system and method for installing infrastructure in a data center are disclosed.

According to one embodiment, a method of minimizing excess installed infrastructure capacity to support computing capacity provided by a plurality of rack computer systems installed in a data center at any given time includes incrementally installing one or more sets of infrastructure modules configured to provide one or more particular types of infrastructure support to at least meet support capacity deficits of the particular types of infrastructure in the data center, where the deficits are determined based at least in part upon a determination that the excess support capacity, of presently-installed infrastructure modules in the data center to provide additional support of the particular type of infrastructure beyond a present total support requirement to support computing operations of presently-installed rack computer systems in the data center, fails to at least meet the support requirements of the inbound rack computer systems. A set of infrastructure modules which provide an incremental support of the particular type of infrastructure which overcomes the deficit are selected and installed, concurrently with installation of the rack computer systems, so that the presently-installed infrastructure modules have an excess support capacity which at least meets the total support requirements of installed rack computer systems for the particular type of infrastructure.

According to one embodiment, a method includes incrementally adjusting an installed support capacity of each of multiple particular types of infrastructure support, independently of each other. Such incremental adjustment includes, for each particular type of infrastructure support, incrementally installing one or more sets of infrastructure modules in an enclosure, based at least in part upon a determination that an excess installed support capacity, of the particular type of infrastructure support, in the enclosure is less than a certain threshold quantity. Each set of infrastructure modules comprises a selected quantity of infrastructure modules configured to provide an incremental magnitude of the particular type of infrastructure support.

According to one embodiment, a system includes multiple infrastructure monitoring modules, a capacity trigger module, and a capacity distribution module. Each separate infrastructure monitoring module determines a present excess support capacity, of a separate type of infrastructure support of multiple types of infrastructure support in an enclosure, provided by separate set of remote infrastructure modules which are configured to provide the separate type of infrastructure support. The capacity trigger module independently determines, for each separate type of infrastructure support, that the present excess support capacity is less than a capacity threshold value associated with the separate type of infrastructure support. The capacity distribution module commands incremental installation, in the enclosure, of one or more selected sets of infrastructure modules, which are configured to provide the separate type of infrastructure support, to increase the present excess support capacity of the separate type of infrastructure support to at least meet the capacity threshold value.

As used herein, an "aisle" means a space next to one or more racks.

As used herein, "computing" includes any operations that can be performed by a computer, such as computation, data storage, data retrieval, or communications.

As used herein, "computer room" means a room of a building in which computer systems, such as rack-mounted servers, are operated.

As used herein, "computer system" includes any of various computer systems or components thereof. One example of a computer system is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). Alternatively, a compact disc-read only memory (CD-ROM), a magneto-optical disk (MOD), and/or a digital versatile disc (DVD) may also be used. Also, additional input channels may include computer peripherals associated with an operator interface such as a mouse and a keyboard. Alternatively, other computer peripherals may also be used that may include, for example, a scanner. Furthermore, in the some embodiments, additional output channels may include an operator interface monitor and/or a printer.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, "room", "hall", etc. means a room, space, enclosure, etc. of a structure. A "computer room" means a room in which computer systems, such as rack-mounted servers, are operated.

As used herein, a "space", "enclosure", etc. means a space, area or volume.

As used herein, a "module" is a component or a combination of components physically coupled to one another. A module may include functional elements and systems, such as computer systems, racks, blowers, ducts, power distribution units, fire suppression systems, and control systems, as well as structural elements, such a frame, housing, structure, container, etc. In some embodiments, a module is prefabricated at a location off-site from a data center.

In some embodiments, a data center is configured to install rack computer systems to provide computing capacity for the data center. The rack computer systems can be installed such that the rack computer systems are mounted in a particular position and are coupled to one or more of a power source and a communication network, via Just-In-Time (JIT) infrastructure that enables JIT installation of computing capacity and infrastructure in the data center.

As used herein, "Just-In-Time" (JIT) refers to a system where elements are provided to meet a demand concurrently with the manifestation of that demand. Under such a system, the elements are not provided in surplus or in advance of such manifestation of demand. Such a system can result in reduced inventory, reduced excesses in capacities, etc. As used herein, JIT installation can refer to installing an element concurrently with a determination of a need for the element to be installed to satisfy demand. Such demand for computing capacity can include presently-occurring demand. In some embodiments, such demand can include demand which is projected to be presently-occurring concurrently with the future installation of the element. For example, where installation of an element requires approximately 5 consecutive days of elapsed time to complete, JIT installation of the element can include installing a quantity of an element in response to a determination that demand that will occur in approximately 5 days' time will require the element to be installed to satisfy that demand. In some embodiments, a JIT installed element is not installed prior to such a determination. JIT installation of an element can include ordering the element to be delivered to a site for installation. As used herein, installation of elements, in amounts that correspond to the demand or need for such elements, may be referred to as "incremental" installation of such elements.

As an example of JIT installation of an element, JIT installation of computing capacity in a data center can refer to installing a certain number of rack computer systems which would provide a certain amount of computing capacity in a data center, concurrently with a determination that the certain amount of computing capacity will be required to satisfy demand for computing capacity at the data center which will occur approximately concurrently with the installation of the rack computer systems in the data center. In other words, JIT installation of rack computer systems can include installing rack computer systems in response to a determination that there is a need for such computing capacity to satisfy a demand for such computing capacity that will occur concurrently with installation of those rack computer systems. JIT installation of rack computer systems can include installing the rack computer systems in response to a determination that the above demand is presently-occurring. For example, where a data center is constructed to accommodate 20 rows of server racks and installation of such racks is determined to require 2 days of time, and five racks' worth of computing capacity is determined to be needed to satisfy computing capacity demand for the data center in approximately 2 days' time, five racks can be installed in the data center in response to such a determination. Additional racks can be installed, replaced, removed, etc. as the needed computing capacity changes over time.

In some embodiments, JIT installation refers to installing an element which is configured to support another element, concurrently with JIT installation of the other element. For example, JIT installation of infrastructure can include the infrastructure in a data center being installed incrementally and concurrently with installation of computing capacity in the data center, which can include JIT installation of computing capacity. Therefore, JIT infrastructure can be installed to support incremental installation of computing capacity in response to a determination that the incremental computing capacity is needed. In some embodiments, JIT infrastructure is installed subsequent to the above determination and concurrently with receipt and installation of the rack computer systems which provide the computing capacity at the data center.

Similarly to JIT installation of computing capacity, where the computing capacity installed is incremental and can provide an amount of computing capacity that satisfy the determined need for computing capacity, the JIT infrastructure can be installed incrementally and in a scale that corresponds to the incremental computing capacity being installed and which is to be supported by the JIT infrastructure. Similarly to the JIT installation of computing capacity being an installation of a minimally-sufficient amount of rack computer systems to provide the needed computing capacity, the JIT infrastructure installed can be a minimally-sufficient infrastructure to support the incremental computing capacity being installed. In some embodiments, JIT infrastructure is installed concurrently with the infrastructure being needed to support incremental changes in computing capacity in the data center, and not before the incremental change in computing capacity is determined to be needed. As a result, the infrastructure for a data center need not be installed upon initial completion of the data center, such that excess infrastructure is present immediately upon completion of the data center and remains unused in the data center until the needed computing capacity increases to utilize the excess infrastructure.

JIT infrastructure, in some embodiments, includes separate "sets" of "infrastructure modules" associated with each separate type of infrastructure support which supports computing operations in the data center. Various types of infrastructure support, as referred to herein, can include one or more of electrical power support, cooling support, network communication support, structural support, etc. For each separate type of infrastructure, support of said type can be provided by one or more "sets" of infrastructure modules which each provide an incremental magnitude (also referred to interchangeably herein as an incremental "amount", "quantity", etc.) of the associated type of infrastructure support. For example, electrical power support can be provided, in incremental quantities of electrical power, by one or more sets of electrical power distribution modules, where each module is configured to provide a certain amount of electrical power to provide a certain amount of electrical power support to one or more electrical loads in the data center. In another example, cooling support can be provided, in incremental amounts by one or more sets of air handling modules, where each module is configured to provide a certain amount of cooling air flowrate to provide a certain amount of cooling support to remove heat from various electrical loads in the data center. Installing various quantities of each particular set of infrastructure modules can result in providing various amounts of separate types of infrastructure support in the data center.

As used herein, providing infrastructure "support" refers to providing one or more types of infrastructure support to be available to support operations by one or more downstream systems and components, including one or more electrical loads, rack computer systems, etc. The type and quantity of support provided by various infrastructure modules varies based at least in part upon the type of infrastructure support being provided by said modules. For example, an electrical power module which is configured to provide electrical power support to electrical loads in a data center can be configured to distribute an electrical power feed to one or more downstream systems and components. An electrical power module may distribute electrical power directly to an electrical load via one or more power transmission lines, indirectly via one or more instances of power distribution infrastructure, busways, tap boxes, patch cabling, intermediate components including automatic transfer switch (ATS) assemblies, etc. In another example, one or more sets of air handling modules which are configured to provide cooling support in a data center include separate air moving devices which are each configured to induce a certain amount of airflow and are mounted in arrays to provide a certain amount of collective airflow of cooling air into the data center to remove heat from electrical loads installed in the data center.

In some embodiments, providing infrastructure "support" includes making a quantity of one or more certain types of infrastructure available for use by one or more electrical loads, although such available infrastructure may not be presently utilized at all times. For example, where an electrical power module provides electrical power support via providing an electrical power feed to one or more systems and components via one or more busways, power transmission lines, etc., such provided power feeds may be precluded from being received by the systems and components but may be made available for receipt based at least in part upon a positioning of one or more components upstream of the systems and components. For example, a reserve electrical power distribution module may provide reserve power support to an electrical load by providing a reserve power feed that can be selectively routed to the load by a transfer switch (which can be included in an ATS) that is downstream of the reserve power system and upstream of the load, where the transfer switch may selectively route the reserve power feed or a primary power feed to the load based at least in part upon one or more conditions associated with the primary power feed.

Network communication infrastructure, which can refer to one or more instances of communication cabling, networking devices, router devices, etc., which can be installed incrementally in the data center, concurrently with incremental changes in desired computing capacity in the data center over time to require such incremental changes, to support incremental changes in computing capacity in the data center. Networking devices can include network switch devices, console switch devices, router devices, main distribution frames, etc. In some embodiments, installing infrastructure concurrently with changes in the desired computing capacity includes installing one or more infrastructure modules to communicatively support one or more rack computer systems based at least in part upon a determination that the one or more rack computer systems are to be installed to provide an incremental change in computing capacity for the data center, are ordered or en-route to being delivered to the data center, are delivered and are in preparation for installation in the data center, are mounted in a particular position in the data center, etc.

The increment of network communication infrastructure modules installed in a data center concurrently with installation of a number of rack computer systems in the data center can include one or more networking devices, instances of cabling, etc. which are minimally sufficient to communicatively support computing operations by that number of rack computer systems. Communicative support can refer to supporting communications between the supported element and one or more various external elements. For example, cabling infrastructure which communicatively couples a rack computer system with a communication network via a main distribution frame communicatively supports the rack computer system. Cabling can include various instances of cabling which are installed "Just in Time", concurrently with installation of a rack computer system in a data center to communicatively support the rack computer system. For example, a patch cable connection which extends between an interface of the rack computer system and an interface of another component to establish a "direct patch cable connection" and is installed in the data center concurrently with installation of the rack computer system in the data center may be referred to as a just-in-time (JIT) direct patch cable connection between the rack computer system and the component. Such a component can include a network switch device, which can be installed, as part of network communication infrastructure, concurrently with the determination that the rack computer system is to be installed to satisfy demand. In another example, a fiber optic cabling connection which extends between respective interfaces of respective components, including an interface of a network switch device and an interface of a main distribution frame, to establish a "fiber optic cable connection", and is installed in the data center concurrently with installation of the one or both of the components in the data center, may be referred to as a just-in-time (JIT) fiber optic cable connection between the two components. Such a fiber optic cable connection may be direct, such that the fiber optic cable connection is via a single instance of fiber optic cabling between respective interfaces of the two components. Such a fiber optic cable connection may be indirect, such that the fiber optic cable connection is via multiple instances of the fiber optic cabling, which may be communicatively coupled via one or more interfaces in one or more intermediary components between the two components.

In some embodiments, network communication infrastructure installation includes one or more network communication infrastructure modules installed in increments concurrently with a determination of a need for such increments of network communication infrastructure to support computing operations in the data center. Network communication infrastructure support can include network switching support provided by one or more network switch devices, where the network switch devices and associated equipment may be referred to as network communication infrastructure modules. As a result, infrastructure installation concurrently with rack computer system installation can include installing one or more network communication infrastructure modules in the data center concurrently with a rack computer system being installed, where the rack computer system is coupled to the installed network switch devices to communicatively couple the rack computer system with a communication network via a network zone in the data center. As used herein, a network zone refers to a region of the data center in which a main networking trunk is located, and can include one or more main distribution frames, demarcation racks, etc.

In some embodiments, network communication infrastructure installation includes installing cabling in the data center to provide communicative support to a rack computer system concurrently with the rack computer system being installed in the data center. Such installing of cabling can include installing just enough cabling to support the installed rack computer system, such that additional cabling is installed concurrently with each rack computer system installed in the data center. Such JIT cabling can preclude cabling infrastructure designs that are established and at least partially installed prior to determinations that the support provided by the cabling infrastructure is needed to support present computing capacity.

Cabling infrastructure can include one or more instances of cabling which can be installed incrementally and can preclude prefabricated cabling assemblies, including some or any structured cabling, copper trunk assemblies, which may be designed to provide excess support than may be needed to support incremental changes in data center computing capacity. Such instances can be referred to as cabling infrastructure modules. For example, cabling infrastructure modules can include one or more instances of patch cables, Ethernet cables, etc. which can directly link support equipment to rack computer systems over short to moderate distances, while fiber optic cables can link rack computer systems to the network zone, directly or via one or more sets of support equipment. Such cabling, in some embodiments, can be installed in increments that correspond to concurrent changes in desired computing capacity in the data center. For example, patch cables can link a rack computer system to a network switch concurrently with the rack computer system being mounted in a position in the data center, and the patch cables need not be installed until such mounting occurs. In addition, fiber optic cables can be installed in the data center to link a network switch device, console switch device, etc. with the network zone concurrently with installation of such switch devices in one or more positions in the data center.

In some embodiments, installing a network switch device in a rack position in the row of positions enables communicative coupling of rack computer systems in the row with one or more communication networks independently of prefabricated cabling assemblies, copper trunk assemblies etc. For example, a fiber optic cable connection, including a single-mode connection, multi-mode connection, etc. can be sufficient to enable communication between the rack computer systems in the row and the network, and fiber optic cables can be installed as needed (just-in-time), rather than being installed as an assembly prior to the capacity of the assembly being fully required in the data center, thereby mitigating waste. Furthermore, fiber optic cable connections between the network switch device in a row of rack computer systems and the network zone can be less than the cost of a copper trunk assembly extending from the network zone to one or more separate rows of rack computer systems or open rack positions.

In some embodiments, a network switch device can be installed in various positions in a row of rack positions. Certain positions may be more desirable for network switch device installation than others. For example, installing a network switch device at a central rack position, which can include one or more positions which are approximately equally distal from end positions at the end of a row, can enable the network switch device to be coupled to rack computer systems mounted adjacent to either side of the network switch device via patch cables having a length that is substantially less than the full length of the row. A patch cable coupling a network switch device installed in a central position with a rack computer system mounted at an end position may have a length which is approximately half the length of the row, which may be the maximum patch cable length required to couple rack computer systems in any position in the row with the installed network switch device. As a result, shorter patch cables can be used to couple the network switch device installed in a central position with rack computer systems mounted in the row. In addition, less variation of patch cables can be needed, as patch cables of a common length can couple rack computer systems coupled on either side of a centrally-installed network switch device.

Electrical power infrastructure, in some embodiments, includes one or more sets of electrical power modules which each provide a separate electrical power feed to provide a certain amount of electrical power support. Electrical power feeds from separate electrical power modules can be combined to provide a total electrical power feed in a data center. For example, electrical power feeds distributed from each of several installed electrical power modules can be coupled to a common power busway assembly which extends at least partially through the data center, where the combined electrical power output of the installed electrical power modules can be distributed, via various electrical connections to the power busway assembly, to various electrical loads in the data center. Each electrical power module can include one or more sets of electrical power distribution components, including one or more utility transformers, backup power systems, switching devices, uninterruptible power supplies (UPSs), power distribution units (PDUs), etc. Each electrical power module can include the multiple components mounted in a common substructure to allow for a palletized or "skid" delivery and installation of the module as a single unit. Each electrical power module can have a form factor and can be assembled, tested, and commissioned at an off-site facility. Electrical power modules can each be mounted in assigned positions in the data center as a separate unit, and a power feed inlet and outlet connections can be established, to install the respective modules in the data center. Each electrical power module can be connected, at an inlet end, to one or more various power feeds, including a common utility power feed, one of multiple separate power feeds, etc. Each electrical power module can be connected, at an outlet end, to one or more various power line infrastructure modules, including one or more power busways, etc.

Power line infrastructure, in some embodiments, includes power cabling, power busway assemblies, etc. which is installed incrementally to support computing capacity concurrently with the computing capacity being added in the data center, via installation of rack computer systems in the data center, and in increments configured to support the incrementally added computing capacity. For example, where a number of rack computer systems are to be installed in a data center, Power line infrastructure that can distribute electrical power from one or more electrical power modules to the number of rack computer systems, to provide electrical power support to the rack computer systems, can be installed in an increment which can provide the support needed to support that number of rack computer systems. The increment of installed power line infrastructure can include one or more power busway segments which, when coupled together to form or extend one or more power busway assemblies, is minimally sufficient to distribute one or more electrical power feeds to provide electrical power support to that number of rack computer systems. Such segments may have a minimally sufficient length to be coupled, via one or more tap box assemblies, to one or more upstream components, including ATS assemblies, which distribute electrical power to the rack computer systems via one or more instances of power cabling. The one or more sets of power line infrastructure can be installed in the data center concurrently with the number of rack computer systems being installed. Electrical power support can refer to supporting electrical power distribution between one or more electrical power distribution modules and the supported element. JIT power line infrastructure can include various sets of infrastructure components, including "modules", which are installed "Just in Time", concurrently with installation of a rack computer system in a data center to communicatively support the rack computer system. Power line infrastructure modules can include one or more instances of power cabling of a certain length, one or more power busway segments which can be coupled together to form or extend one or more power busway assemblies, etc.

Cooling infrastructure, in some embodiments, includes one or more air handling modules mounted in an array to provide a cumulative flowrate of cooling air into a data center. For example, cooling infrastructure can include an air handling array which comprises an array of ports, each port configured to accommodate a separate air handling module. The array of ports can be a vertically-oriented array, thus forming a "fanwall" when the ports accommodate air handling modules. Each air handling module can include one or more air moving devices, air cooling systems, etc. which are each configured to provide a certain flowrate of cooling air. For example, each air handling module can include one or more air moving devices, including a fan, blower, etc., which can induce a certain volumetric flowrate, mass flowrate, flow velocity, etc. of air. Mounting one or more air handling modules in a fanwall array can result in a an array which is configured to provide a certain cooling air flowrate which can be a sum of the cooling air flowrates provided by each of the separate mounted air handling modules. Adjustment of the cooling support provided by cooling infrastructure can include one or more of adjusting the air flowrate induced by the one or more installed air handling units, installing additional air handling modules in various empty ports in a fanwall array, etc. Where no ports are available in an array, an additional array can be installed, and air handling modules can be mounted in the additional array. In some embodiments, each array discharges air into a data center in which multiple sets of rack computer systems are installed, without restriction to a specific set of rack computer systems. As a result, each air handling module can provide a portion of cooling support to each of the electrical loads in the data center.

Additional JIT infrastructure, including structural infrastructure, cold aisle and hot aisle containment, infrastructure routing structures, etc. can be installed concurrently with installation of rack computer systems to provide the amount of additional support required to support the installed rack computer systems when the rack computer systems are installed. As used herein, installing JIT infrastructure "concurrently" with installation of rack computer systems can refer to installing the infrastructure in response to determination that the rack computer systems are to be installed. Such installation can occur after the determination and prior to the mounting of the rack computer systems in position in the data center, in response to the rack computer systems arriving at the data center, in response to the rack computer systems being mounted in position, etc.

In some embodiments, an aisle space can include one or more sets of cable trays which each extend along one or more rows of rack positions in the aisle space. A set of cable trays can support and route cables between various components installed in the rack positions with other components mounted in the rack positions, components external to the rack positions, components external to the aisle space, etc. A set of one or more cable trays extending along a given row of rack positions, which may be referred to as a structural infrastructure module, may extend in an elevated position above the row, so that the set of cable trays extends above rack computer systems, network switch devices, etc. installed in the rack positions. In some embodiments, where an aisle space includes two rows of rack positions extending along opposite side ends of the aisle, separate sets of cable trays extend above each separate row of rack positions.

In some embodiments, one or more sets of infrastructure modules configured to provide a particular type of infrastructure support are selected and installed in a data center based at least in part upon changes in the support capacity of the installed infrastructure in the data center to provide the particular type of infrastructure support. As referred to herein, support "capacity" of installed infrastructure modules to provide a particular type of infrastructure support can be referred to as installed support capacity of the particular type of infrastructure support and can include a total capacity of one or more sets of infrastructure modules to provide a certain type of infrastructure support. Support capacity can refer to the amount of "excess" support, beyond the support requirements of the various components presently installed in the data center, which can be provided by the installed infrastructure modules. Support capacity for each type of infrastructure support (e.g., electrical power, power line distribution, cooling, networking, structural, etc.) can be monitored continuously. Where support capacity of a particular type of infrastructure support falls below a certain threshold value, a quantity of infrastructure modules which are configured to provide that particular type of infrastructure support can be installed to increase the support capacity above a threshold value, which may be the same threshold value, a different threshold value, etc.

Because infrastructure support capacity is separate for each type of infrastructure, support capacity of each separate type of infrastructure support can be changed independently of other types of infrastructure support, based at least in part upon independent installation of separate sets of infrastructure modules. Each separate set of infrastructure modules can be installed based at least in part upon separate sets of support capacity "trigger" thresholds for each separate type of infrastructure support. For example, where electrical power support capacity by the installed electrical power modules falls below a threshold value, but cooling support capacity, networking support capacity, structural support capacity, power line support capacity, etc. do not, a quantity of electrical power modules sufficient to increase electrical power support capacity above a threshold value are installed and connected to the power line infrastructure without installing additional infrastructure of other types. In addition, where each type of infrastructure is provided, by the various sets of infrastructure modules, to the data center as a whole rather than being restricted to a particular set of rack computer systems, increases, changes, etc. in support requirements for a set of rack computer systems, including replacing an installed rack computer system with a new rack computer system with different support requirements, can be addressed through installing additional infrastructure modules elsewhere in the data center.

In some embodiments, the installed support capacity for one or more types of infrastructure support is associated with the support requirements of installed rack computer systems and the support requirements of rack computer systems which are inbound for delivery to the data center and installation therein. Where a rack computer system is inbound to a data center, information associated with the rack computer system can be obtained which can be used to determine whether to adjust the installed support capacity for one or more various types of infrastructure support, and which infrastructure modules to select to install in the data center to implement such adjustment. Such information can indicate the specific support requirements, of the various types of infrastructure support, needed to support computing operations by the inbound rack computer system. The support requirements for each type of infrastructure support can be compared with the present support capacity of various types of infrastructure support, and additional infrastructure modules configured to provide one or more certain types of infrastructure can be installed where the installation of the inbound rack computer system is determined to reduce support capacity of the one or more certain types of infrastructure below a threshold. For example, where the electrical power requirements of an inbound rack computer system exceed the excess electrical power support capacity of the installed electrical power modules, such that installation of the inbound rack computer system would result in an electrical power deficit, one or more electrical power modules can be installed to provide an amount of electrical power support which at least matches the deficit. In some embodiments, the quantity of infrastructure modules is selected to minimize the support capacity, so that excess infrastructure is minimized at any given time.

FIG. 1 is a schematic diagram illustrating a data center in which various infrastructure modules are selected and installed in a data center to provide various types of infrastructure support to installed rack computer systems in the data center.

System 100 includes a data center 102 which includes rack computer systems 110 which provide computing capacity 112 via performing computing operations. Data center 102 includes various sets of infrastructure 120-150 which each provide various types of infrastructure support to support computing operations by the rack computer systems 110 installed in the data center 102.

Power infrastructure 120, also referred to herein interchangeably as electrical power infrastructure, includes one or more instances of power line infrastructure 122 and electrical power modules 124 which provide electrical power support 126 to the rack computer systems 110. Instances of power line infrastructure 122 can include one or more power line infrastructure modules, which can include one or more instances of power line cabling, one or more power busways, power busway segments, etc. which can be coupled together to distribute an electrical power feed received from various sources to various locations, electrical loads, etc. throughout the data center. Electrical power modules can each receive an inlet power feed, including a utility power feed from a utility power source, and can distribute an electrical power feed via an outlet connection. Each separate electrical power module 124 can distribute a certain amount of electrical power, and the various electrical power modules installed in data center 102 can be coupled to one or more instances of power line infrastructure 122 to distribute electrical power from the various electrical power modules to various electrical loads in the data center 102. For example, where power line infrastructure 122 includes a power busway assembly which extends throughout the data center and is electrically coupled to the various rack computer systems 110, multiple electrical power modules 124 can be coupled, at outlet ends, with the power busway assembly, at various locations along the busway, to each provide a separate electrical power feed to the busway assembly. The busway assembly can distribute the electrical power, which is collectively received from the coupled electrical power modules at various points, to the various rack computer systems 110 in various locations in the data center 102. As a result, although the various installed electrical power modules 124 may be installed in separate locations, the various modules 124 can provide electrical power support 126 to any of the rack computer systems 110 installed in the data center 102 via one or more instances of the power line infrastructure 122. Where additional electrical power support 126 is required to support computing operations by the rack computer system 110, for example in response to a determination that the electrical power support requirements of a rack computer system which is inbound for installation in data center 102 will exceed the excess electrical power support 126 capacity of infrastructure 120 when installed, one or more additional modules 124 can be installed and coupled to one or more instances of infrastructure 122 to provide the needed additional support 126 to provide sufficient additional electrical power support 126 to support rack computer systems 110 when the inbound rack computer system 172 is installed.

Cooling infrastructure 130 includes one or more air handling modules 134 which each are configured to provide incremental cooling support 136 to the rack computer systems 110, and one or more air handling arrays 132 configured to accommodate the various air handling modules 134 in one or more ports. Air handling modules 134 can each induce a certain amount of cooling air flow into a data center. For example, an air handling module 134 can include one or more air moving devices configured to induce a certain air flow rate, which can each be mounted in various ports in an air handling array 132, where the mounted air moving devices individually provide incremental air flow rates and collectively provide a total cooling air flow through the array and into the data center. Multiple arrays 132 can be installed in a data center 102, and multiple air handling modules 134 can be mounted in each array 132 to provide incremental cooling to the data center. In some embodiments, one or more of the arrays 132 installed in a data center provide cooling support to a data center in which multiple rows of rack computer systems 110 are installed, so that each air handling module in each array provides at last a portion of the cooling support provided to each installed rack computer system 110. Based at least in part upon the arrays 132 of air handling modules providing cooling support to a data center in which various rows of rack computer systems can be installed, air handling modules in one portion of the data center can provide a portion of cooling support to a row of rack computer systems in another portion of the data center, as all of the arrays 132 collectively provide cooling support to the entirety of the data center. As a result, the cooling support provided to the rack computer systems 110 in the data center 102 can be adjusted via installation of various arrays in the data center, installation of various air handling modules in the various arrays, etc. As an example of providing such cooling support, an array 132 can be installed in the data center 102, and a certain quantity of air handling modules 134, which each comprise an air moving device configured to induce certain amount of air flow, are installed in the array 132 to configure the cooling infrastructure to provide a certain collective air flow into the data center 102. The air flow can be cooled by one or more cooling systems. In some embodiments, including embodiments where the cooling infrastructure comprises a free-cooling infrastructure, air cooling systems, separate from air moving devices, are absent. The collective cooling air flow, which can correspond to the cooling capacity of the cooling infrastructure, can at least meet the total cooling requirements of the rack computer systems 110 installed in the data center 102. Where the total cooling requirements change to exceed the cooling capacity of the cooling infrastructure 130, for example where additional rack computer systems 172 requiring additional cooling support that exceeds the excess cooling capacity are installed or are inbound for installation, additional air handling modules can be installed in available array ports to incrementally increase the cooling capacity above the changed total support requirement. Where an insufficient number of array ports are available to accommodate the additional modules, an additional array can be installed in the data center 102, and additional modules can be installed in the available ports of the additional array. Cooling support provided to racks can be at least partially agnostic with regard to relative locations of the rack computer systems 110 and air handling modules 134 in the data center 102, as the air handling modules 134 collectively provide cooling support to the data center 102.

In some embodiments, one or more of the air moving devices are individually adjustable, via one or more variable-frequency drive motors, etc. to provide individually adjustable cooling air flow rates. In some embodiments, one or more of the air handling modules include a separate air cooling system configured to provide an incremental amount of air cooling to an air flow. For example, an air handling module can include an individual evaporative cooling unit, mechanical cooling unit, which is configured to cool a particular portion of an air flow through the air handling module array which flows in heat transfer communication with the air handling module.

Structural support infrastructure 140 includes one or more instances of support structures, also referred to herein as structural support infrastructure modules, which provide structural support 142 to various instances of infrastructure, provide at least partial containment of one or more air plenums, some combination thereof, or the like. For example, structural support infrastructure can include one or more cable trays which can be installed to extend along one or more rows of rack computer systems to route various cabling between various rack computer systems and other infrastructure, support busways extending along a row of rack computer systems, etc. In another example, structural support infrastructure can include various structures which enclose and partition one or more air plenums which direct cooling air to one or more rack computer systems, direct exhaust air away from the one or more rack computer system, partition cooling air from exhaust air, etc. One or more instances of structural support infrastructure, which can include one or more structural support modules which provide structural support to one or more discrete rows, or a discrete portion thereof, can be installed in one or more locations in a data center 102 to provide incremental expansion of structural support 142 to the particular rack computer systems 110 in the respective area of the data center. Additional structural modules can be installed in additional areas of the data center to provide structural support 142 to additional rack computer systems 172, concurrently with the installation of such additional rack computer systems 172 in the data center 102, concurrently with a determination that the additional rack computer systems 172 are inbound for installation in the data center 102, etc.

Network communication infrastructure 150 includes one or more network communication infrastructure modules which provide incremental network communication support 158 to the rack computer systems 110 installed in the data center 102. Network infrastructure modules can include one or more instances of network cabling infrastructure 152, one or more network switch devices, one or more router devices 156, including one or more master routers, etc. Instances of network cabling infrastructure 152, network switching devices 154, router devices 156, etc. can be incrementally installed in the data center 102 to incrementally expand network communication support 158 to the various rack computer systems 110. Network communication support can include communicatively coupling one or more rack computer systems 110 to a communication network, providing bandwidth for such communicative coupling, enabling remote system console access to various rack computer systems 110, etc.

Computing capacity deployment system 180 can be implemented by one or more computer systems and is configured to command delivery of one or more rack computer systems 172, from one or more suppliers 170, to the data center 102 for installation. System 180 can command such delivery based at least in part upon monitoring computing capacity 112 provided by the installed rack computer systems 110 and a determination that additional computing capacity 112 is required. A certain quantity of rack computer systems which are configured to provide at least a certain amount of additional computing capacity, which can at least meet a required additional amount of computing capacity, can be selected and commanded to be delivered by suppliers 170. Suppliers can include one or more vendors of rack computer systems, one or more inventory storage facilities, etc.

Infrastructure capacity distribution system 190 can be implemented by one or more computer systems and is configured to command installation of one or more selected infrastructure modules 162, from one or more instances of module inventory 160, to provide at least a certain amount of infrastructure support of one or more particular types of infrastructure. Instances of module inventory 160, which can also be referred to as inventory sites, include inventory sites local to the data center 102, sites remote from the data center 102, etc. Some inventory sites can be managed by a third-party entity which does not manage system 190, data center 102, suppliers 170, vendors of one or more infrastructure modules stored at the inventory sites 160, etc. Infrastructure modules 162 can include one or more of the various power infrastructure modules 122-124, cooling infrastructure modules 130, structural support modules 140, network communication infrastructure modules 152-156, etc. System 190 can monitor infrastructure support capacity of each of the various types of infrastructure 120-150 in the data center 102 and can select one or more particular infrastructure modules 162 for installation in the hall 102, based at least in part upon a determination that an incremental change in support capacity of one or more particular types of infrastructure support is needed to support computing capacity 112. Such a determination can be based at least in part upon selection, by system 180, of one or more additional rack computer systems 172 to be delivered for installation in the hall 102.

For example, system 190 may monitor support capacity for each of the illustrated types of infrastructure and determine that each type of infrastructure has a support capacity that exceeds a certain threshold value, where the threshold corresponds to a support requirement by the installed rack computer systems 110 for that particular type of infrastructure, a certain margin beyond such support requirement, etc. System 180 may, based at least in part upon a determination that additional computing capacity 112 is required, command one or more suppliers 170 to deliver one or more particular rack computer system 172 to the hall 102 to be installed to provide at least a certain quantity of additional capacity 112. Such a command can include system 180 placing one or more orders for one or more rack computer systems 172. Such a command can include a determination, at system 180, of the various support requirements of the additional rack computer systems 172 for one or more of the various types of infrastructure. Systems 180 and 190, which can be implemented on one or more common computer systems, may communicate so that system 190 receives a notification that the certain number of rack computer systems 172 are inbound to the data center 102. The notification can include the support requirements, of one or more types of infrastructure, for each of the rack computer systems 172. Based at least in part upon the notification, the system 190 can assign one or more available positions in the data center 102 for installation of the inbound rack computer systems 172. In addition, based at least in part upon the notification, system 180 can determine whether, for each type of infrastructure, the incremental support required to support computing operations by the inbound rack computer system 172 exceeds a threshold with regard to the present support capacity of that installed type of infrastructure. For example, system 190 may determine that the excess electrical power support capacity 126 of the installed power infrastructure 120 is insufficient to meet the total power support requirements of the inbound rack computer systems 172. As a result, system 190 selects a quantity of infrastructures modules 162 which provide a quantity of that type of infrastructure support. The quantity of infrastructure modules may be configured to provide a minimum amount of infrastructure support which, upon installation of the infrastructure modules, increase the support capacity of the respective type of infrastructure above a certain threshold value. For example, system 190 may select a minimum number of electrical power infrastructure modules 122, 124 which are configured to overcome a deficit in power support capacity to meet the collective provide electrical power support requirements of both the installed rack computer systems 110 and the inbound rack computer system 172. System 190 can command installation of such selected modules 162. Such commanding can include generating an order to one or more inventory sources 160, which can include one or more inventory facilities, infrastructure modules vendors, etc. Such commanding can include generating commands to one or more operators to install the selected infrastructure modules 162 in one or more particular positions in the data center 102, where the particular positions, quantity of selected infrastructure modules, etc. can be based at least in part upon the positions to which the inbound rack computer systems 172 are assigned to be installed.

Selection of infrastructure modules for installation to provide incremental changes in various types of infrastructure support can be independent with regard to each separate type of infrastructure. As noted above, support capacity can be independently monitored for each of the various types of infrastructures 120-150, and selection and installation of infrastructure modules 162 can be implemented independently with regard to each separate type of infrastructure, based at least in part upon the separate support capacities of the separate types of infrastructure. For example, while system 190 may select an additional quantity of electrical power modules to provide an incremental increase in electrical power support 126, based at least in part upon a determination that the inbound rack computer systems 172 require a certain amount of electrical power support 126 which exceeds one or more thresholds relative to the presently-installed electrical power support capacity, system 190 may determine that presently-installed cooling support capacity, structural support capacity, and networking support capacity are sufficient to support the inbound rack computer systems 172 within one or more respective threshold values, and may therefore refrain from selecting any cooling infrastructure modules, structural support infrastructure modules, and network infrastructure modules 150 for installation.

FIG. 2A-D are schematic diagrams illustrating a data center in which rack computer systems and various infrastructure modules are incrementally installed, according to some embodiments.

Data center 200 includes an interior enclosure 202, which can be referred to as a data center hall, in which data center components, including rack computer systems, can be installed and a receiving area 203 which, in some embodiments, comprises a loading dock at which equipment to be installed in the enclosure 202 can be received from external sources. Enclosure 202 includes portions 210, 220, also referred to as "regions" or "zones" associated with various particular data center components. Particularly, enclosure 202 includes a network zone 220 and multiple server zones 210, also referred to herein as "computer zones". Network zone 220 can include various components which can communicatively couple the various rack computer systems installed in the data center with one or more communication networks. Such components can include one or more main distribution frames, demarcation point racks, master OOB devices, master console routers, etc. Computer zones 210 can each include one or more rows of various rack computer systems which provide computing capacity for the data center 200. Data center 200, in some embodiments, can be included in system 100, illustrated in FIG. 1.

Figure 2A:
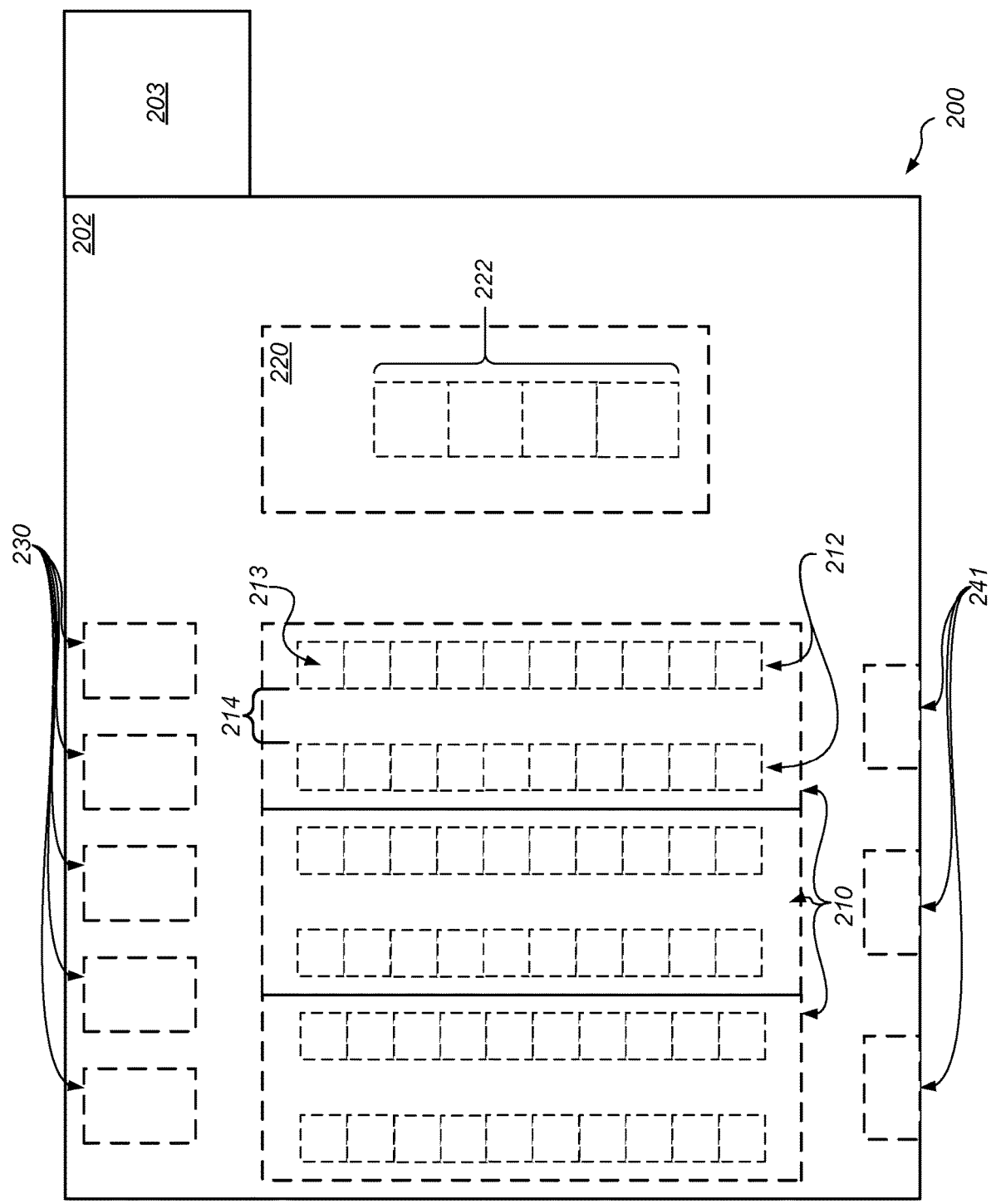

FIG. 2A illustrates data center 200 in a state of initial construction, where rack computer systems have yet to be installed in the data center 200. In the illustrated state of data center 200, server zones 210 each include an aisle space 214 which is established by two rows 212 of rack positions 213 which extend along opposite side ends of aisle space 214. In some embodiments, the locations of at least some rack positions and aisle spaces in the data center enclosure 202 are undefined where rack computer systems are not installed in those rack positions and aisle spaces.

Network zone 220 includes a row of rack positions 222 in which network zone components can be installed. Rack positions 213 and 222 can correspond, in size, dimensions, etc. with various types of known computer rack designs, including standard 19-inch racks, 23-inch racks, etc. pursuant to EIA-310 standards, and various known rack designs.

As shown in the illustrated embodiment, data center 200 in a state of initial construction lacks rack computer systems and infrastructure, including structural support infrastructure, network communication infrastructure, power infrastructure, cooling infrastructure, etc., to support at least rack computer systems. Various positions in the data center enclosure 202 may be demarcated for installation of particular types of infrastructure, although such infrastructure may not be installed at initial construction. For example, multiple electrical power module positions 230 are demarcated in enclosure 202, where one or more electrical power modules can be installed in any of the positions 230. However, at the state of initial construction of data center 200, electrical power modules are not presently installed. Similarly, multiple air handling array positions 241 are demarcated in enclosure 202, where one or more air handling arrays can be installed in any of positions 241.

FIG. 2B illustrates data center 200 in a state where a determination is made that one or more rack computer systems are inbound to be installed in the data center 200. Particularly, FIG. 2B shows rack computer systems 216A-B presently in the process of being delivered to data center 200 at receiving area 203. Such rack computer systems can be delivered via various delivery methods, including by delivery truck. In the illustrated embodiments, rack computer systems 216 are in-transit via inbound delivery truck 219 to receiving area 203.

In some embodiments, where a determination is made that a certain amount of computing capacity is to be added to data center 200, one or more rack computer systems 216 that provide at least the desired computing capacity can be ordered for delivery to the data center 200. Where the data center 200 initially lacks supporting infrastructure for such rack computer systems, one or more infrastructure modules configured to provide at least a certain amount of a particular type of infrastructure support, which can include a minimum amount of support to meet the support requirements of the inbound rack computer systems with regard to the particular type of infrastructure support, are installed in the data center 200 in response to the determination, concurrently with the determination, etc.

For example, in the illustrated embodiment, where rack computer systems 216A-B are inbound for delivery to data center 200 via truck 219, one or more electrical power infrastructure modules, cooling infrastructure modules, structural support modules, and networking modules which each provide at least a minimum amount of a particular respective type of infrastructure support to support computing operations by the inbound rack computer systems 216 are installed in the data center 200. Such infrastructure modules, in some embodiments, are not installed in data center 200 until rack computer systems 216 are ordered for delivery, in-transit, delivered to data center 200, some combination thereof, or the like.

In the illustrated embodiment of FIG. 2B, where rack computer systems 216 are inbound, one or more rack network communication infrastructure modules are installed to provide at least a sufficient amount of network communication support to support computing operations by the inbound rack computer systems. As shown, a single network zone component, main distribution frame (MDF) 224, is installed in a network zone position 222 in network zone 220. MDF 224 is communicatively coupled with at least one communication network via a communication pathway 229, which can include a wired network connection, wireless network connection, some combination thereof, or the like.

A network switch device 226 is installed in zone 210A to provide network communication support to one or more rack computer systems installed in zone 210. In some embodiments, a network switch device is installed in data center 200 based at least in part upon the determination that rack computer systems 216 are to be installed in data center enclosure 202 and a determination that at least one network switch device is required to be installed in data center enclosure 202 to communicatively couple the rack computer systems 216 to the network zone. As a network switch device is not initially installed in enclosure 202, a network switch device may be required to support an installed rack computer system in enclosure 202. Network switch device 226 is installed in one or more rack positions 213 in server zone 210A to provide network communication support to the rack computer systems when the rack computer systems 216 are installed in the server zone 210A. As shown, network switch device 226 can be installed in multiple rack positions 213, including the illustrated two adjacent rack positions 213. The network switch device 226 may be installed in a certain portion of the server zone 210A, including proximate to a central portion of a row 212 in which the rack computer systems 216 are to be installed.

As shown, in some embodiments the network switch device 226 is installed in server zone 210A concurrently with rack computer systems 216A-B being installed in one or more rack positions 213 in zone 210A. For example, network switch device 226 may be installed in rack positions 213 in zone 210A in response to rack computer systems 216 being ordered for delivery and installation in zone 210A. In another example, network switch device 226 may be installed in response to the rack computer systems 216 being received at the data center 200.

In some embodiments, at least some cabling infrastructure is installed in data center 200 in response to network switch device 226 being installed in data center 200. Such installation can include mounting the network switch device 226 in one or more rack positions 213, electrically coupling the network switch device to one or more power sources, communicatively coupling the network switch device 226 to MDF 224, some combination thereof, or the like. In some embodiments, cabling infrastructure that communicatively couples the network switch device 226 to MDF 224 is installed subsequent to network switch device 226 being mounted in server zone 210A and concurrently with rack computer systems 216 being mounted in rack positions 213 in the zone 210A.

In some embodiments, communicatively coupling a network switch device 226 with MDF 224 concurrently with installation of rack computer systems 216 in the data center 200 includes extending a fiber optic cable connection 225 from an interface of the network switch device to an interface of the MDF. The fiber optic cable connection 225 may be extended in response to installation of the network switch device 226 in the data center enclosure 202, so that such a connection is just-in-time and does not provide excess communicative support in data center 200. The fiber optic cable connection can be direct between the network switch device 226 and MDF 224.

In some embodiments, at least some infrastructure modules which are installed based at least in part upon a determination that rack computer systems are inbound to be installed in the data center comprises separate sets of infrastructure modules that are each provide a minimally sufficient amount of a certain type of infrastructure support to support the rack computer systems and are installed concurrently with the installation of the rack computer systems. Such infrastructure may be referred to as JIT infrastructure, as the infrastructure is installed in the data center as needed and "just in time" to support the installed rack computer systems and is "just" enough to support the installed rack computer systems. The rack position in which an inbound rack computer system is to be installed may be determined and assigned prior to installation of an ordered rack computer system, and at least some supporting infrastructure, including JIT infrastructure, is installed for the determined rack position, a row or selection of rows including the rack position, etc. subsequent to the determination that the rack computer system is to be installed in the data center.

In the illustrated embodiment of FIG. 2B, where rack computer systems 216 are inbound, one or more rack electrical power modules 232A, enclosure power busway assembly 235, aisle power busway assembly 236, and automatic transfer switch (ATS) assembly 237 are installed in the enclosure to provide electrical power support to rack computer systems inbound for installation in zone 210A. Module 232A can be configured to receive a power feed 233 from a utility source, including a power feed from a utility transformer, and distribute an output power feed 234. The output power feed can include an output power feed from a UPS in the module 232A, a power feed which has been stepped-down by a transformer in module 232A, etc. the output of module 232A is coupled to a power busway assembly which includes power busway segment 235A, so that power output feed 234 can be distributed to various zones in the enclosure 202 via the busway segment 235A. The assembly which includes segment 235A can be extended, via coupling additional segments to segment 235A in series, to extend the assembly through the enclosure 202 to positions proximate to multiple zones 210 to distribute electrical power to the various zones 210. In the illustrated embodiment, as racks are presently inbound for installation only in zone 210A, the busway assembly which comprises segment 235A need not be extended, as the remainder zones 210 lack electrical loads to which the power feed 234 can be distributed.

Aisle busway assembly 236, in the illustrated embodiment, includes a single busway segment 236 which extends through a portion of the aisle of zone 210 through which the inbound rack computer systems 216 are assigned to be installed. Because other rack positions are not to be occupied by the inbound rack positions, assembly 236 does not need to extend to the other positions. As a result, assembly 236 includes a minimum quantity of busway segments needed to provide electrical power support to the rack positions to which the inbound racks are assigned to be installed, and various other infrastructure modules installed in the zone 210. ATS assembly 237, which can include an assembly of one or more ATSs, is installed in an available rack position 213 and is electrically coupled, via one or more power inlet connections, to busway assembly 236 via a tap box and power cable connection. Branch circuits 221 are coupled to one or more power outlets of the ATS assembly 237 and one or more electrical loads to distribute power from the ATS assembly to the various loads. As the network switch 226 is installed in zone 210A, a branch circuit 221 is installed to distribute power to the network switch 226 from ATS assembly 237. As ATS assembly 237 is configured to distribute electrical power to electrical loads in proximate rack positions 213, busway assembly 236 is installed in a sufficient number of segments which extend to couple with ATS assembly 237 and distribute electrical power from module 232A and assembly 235 to the ATS assembly 237. Assembly 236 can be coupled to assembly 235 via a feed box at the end of the assembly 236 which is proximate to assembly 235, as shown in FIG. 2B.

In some embodiments, multiple busway assemblies can be incrementally installed to extend through the data center hall 202 in various regions of the data center hall 202, and multiple busway assemblies 236 can be incrementally installed to extend through a given aisle. Where multiple busway assemblies 236 extend through a given aisle 214, the two or more assemblies 236 can extend from opposite ends of the aisle 214. For example, another busway assembly can extend along the opposite end of the aisles 214 of zones 210, relative to assembly 235. In some embodiments, where separate busway assemblies extend along opposite ends of zones 210, each separate busway assembly can carry power from a separate set of electrical power modules 232. For example, busway assembly 235, extending along one end of zones 210, can carry power from a first set of power modules 232 (e.g., "A" power) while another busway assembly, extending along an opposite end of zones 210 relative to assembly 235, can carry power from another separate set of power modules 232 (e.g., "B" power). In addition, while one busway assembly 236 can couple to busway assembly 235 and extend at least partially through the aisle 214 of a zone 210 from the end of the aisle 214 along which assembly 235 extends, another busway assembly 236 can couple to the busway assembly extending along the opposite end of the aisle 214 and can extend from the opposite end through at least a portion of the aisle 214. As a result, where at least two busway assemblies 236 extend at least partially though an aisle 214 from opposite ends of the aisle, the separate busway assemblies can extend through a common portion of the aisle, for example in a central portion of the aisle. As a result, equipment mounted in rack positions proximate to such a common portion of the aisle 214 can be configured to receive power from one or both of the power modules via the separate busway assemblies extending through the aisle from opposite ends. In some embodiments, certain infrastructure modules are assigned to rack positions located in such a common portion, so that such modules can receive electrical power support from one or more of the separate busway assemblies 236 extending through the common portion of the aisle 214. Such infrastructure modules can include network switch devices, ATS assemblies, etc.

In the illustrated embodiment of FIG. 2B, where rack computer systems 216 are inbound, one or more air handling arrays 240A are installed in one or more available positions 241, and one or more air handling modules 246 are installed in available ports 244 therein, to provide sufficient cooling support to support computing operations by rack computer systems inbound for installation in enclosure 202. Array 240A can include an air intake 242A, which can be in flow communication with an ambient environment, an air cooling system, etc. and can be configured to accommodate multiple air handling modules 246 which individually provide an incremental amount of cooling support, to provide a collective amount of cooling support to enclosure 202. The quantity of air handling modules 246 installed can correspond to a total cooling support capacity of the total air handling modules 246 and can at least meet a total cooling support required to support at least the inbound rack computer system 216, the various other installed infrastructure modules 226, 232, 234, 237, etc. In some embodiments, the various modules 246 are electrically coupled to one or more electrical power modules 232A, including via one or more connections to one or more enclosure busway assemblies 235.

One or more structural support infrastructure modules are installed to provide structural support to the inbound rack computer systems. As shown, an infrastructure module which comprises a cable tray 217A is installed in zone 210A to provide structural support to one or more instances of cabling installed in the particular row of rack positions in which the rack computer systems 216 and one or more supporting infrastructure modules 237, 226 are installed. In some embodiments, one or more structural support infrastructure modules can include interior exhaust enclosures configured to receive and direct exhaust air from installed rack computer systems installed in rack positions in one or more rows out of server zone 210A, are installed proximate to the one or more respective rows of rack positions 213, so that an installed rack computer system can discharge exhaust air into a proximate exhaust structure.

Figure 2C:
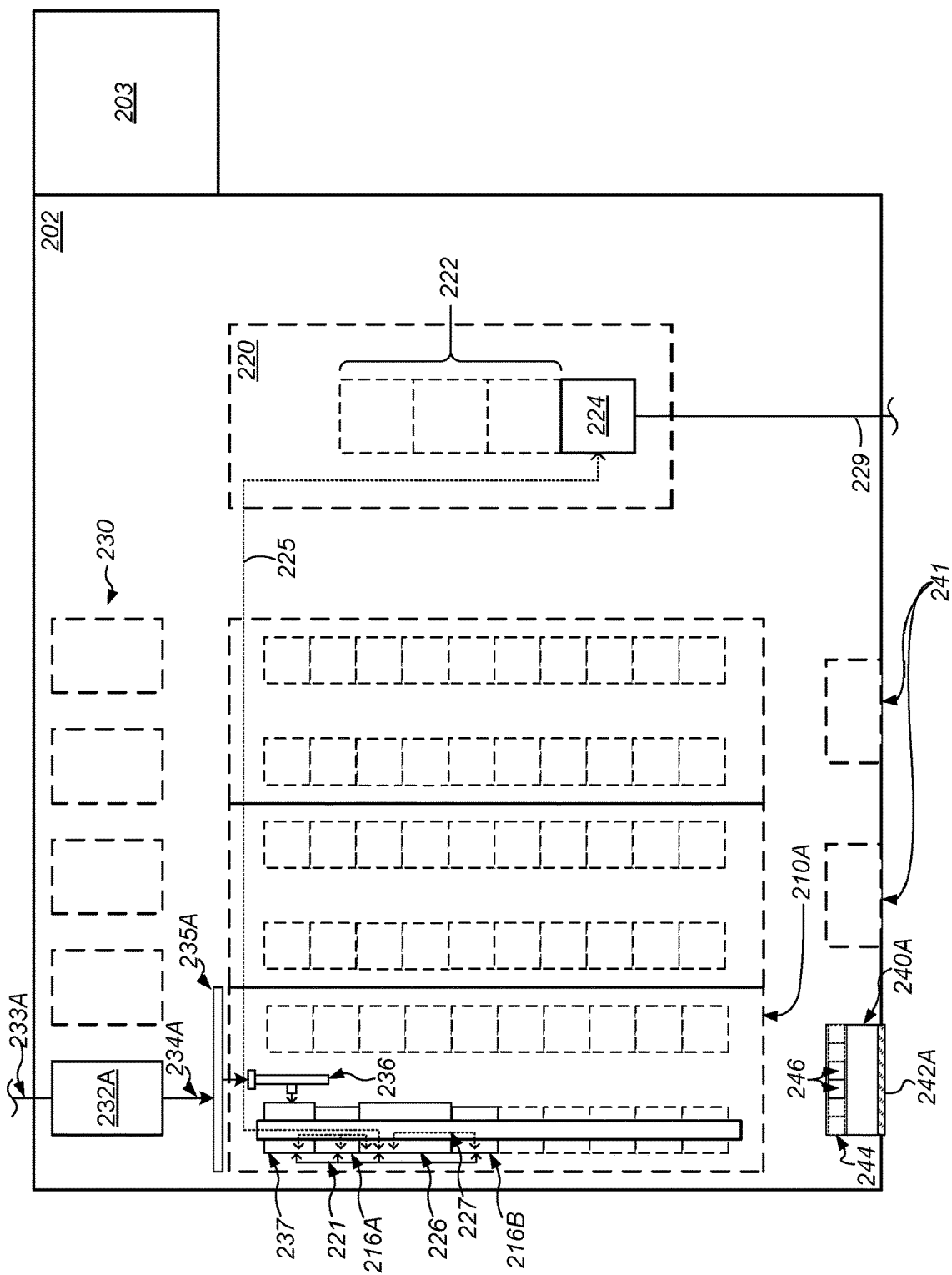

FIG. 2C illustrates data center 200 in a state where ordered rack computer systems 216-B are received at the data center 200 and are installed in one or more rack positions 213 in zone 210A. Rack computer systems 216A-B can be installed concurrently with incremental installation of various JIT infrastructure modules, including cabling infrastructure modules, network communication infrastructure modules, cooling infrastructure modules, power infrastructure modules, structural support infrastructure modules, etc.

As shown, rack computer systems 216A-B are installed in rack positions 213 in zone 210A. In some embodiments, rack computer systems are installed in available rack positions 213 with a closest proximity to an installed network switch device 226.

In some embodiments, including the illustrated embodiment, at least some instances of cabling infrastructure is installed in data center 200 concurrently with the installation of rack computer systems 216A-B in the data center 200 to communicatively couple the rack computer systems to one or more communication networks. Rack computer systems 216A-B are communicatively coupled with network switch device 226 via direct communication pathways 227, which can include direct patch cable connections between the rack computer systems 216 and the network switch device 226. As network switch device 226 is communicatively coupled with MDF 224 via fiber optic cable connection 225, patching rack computer systems 216 mounted in rack positions 213 to network switch device 226 via one or more direct patch cable connections 227 communicatively couples the rack computer systems 216 to at least the MDF 224, thereby communicatively coupling the rack computer systems 216 to a communication network and enabling network interaction with the rack computer systems 216.

In some embodiments, the cabling infrastructure installed concurrently with the installation of rack computer systems 216 in data center 200 is free from copper cable connections.

For example, communication pathways 227 can be patch cable connections, and communication pathways 225 can be fiber optic cable connections.

As shown in FIG. 2C, based at least in part upon a determination that one or more rack computer systems are inbound for installation at data center 200, various sets of infrastructure modules are installed in the enclosure 202 to provide at least a sufficient amount of various respective types of infrastructure support to support computing operations by the inbound rack computer systems. The quantity of each type of infrastructure module can be based at least in part upon the support requirements of the inbound rack computer systems with regard to the respective type of infrastructure support. As shown, the quantity of each set of infrastructure modules installed can be a minimally-sufficient quantity to provide minimally-sufficient amounts of the various types of infrastructure support to support the inbound rack computer systems.

Figure 2D:
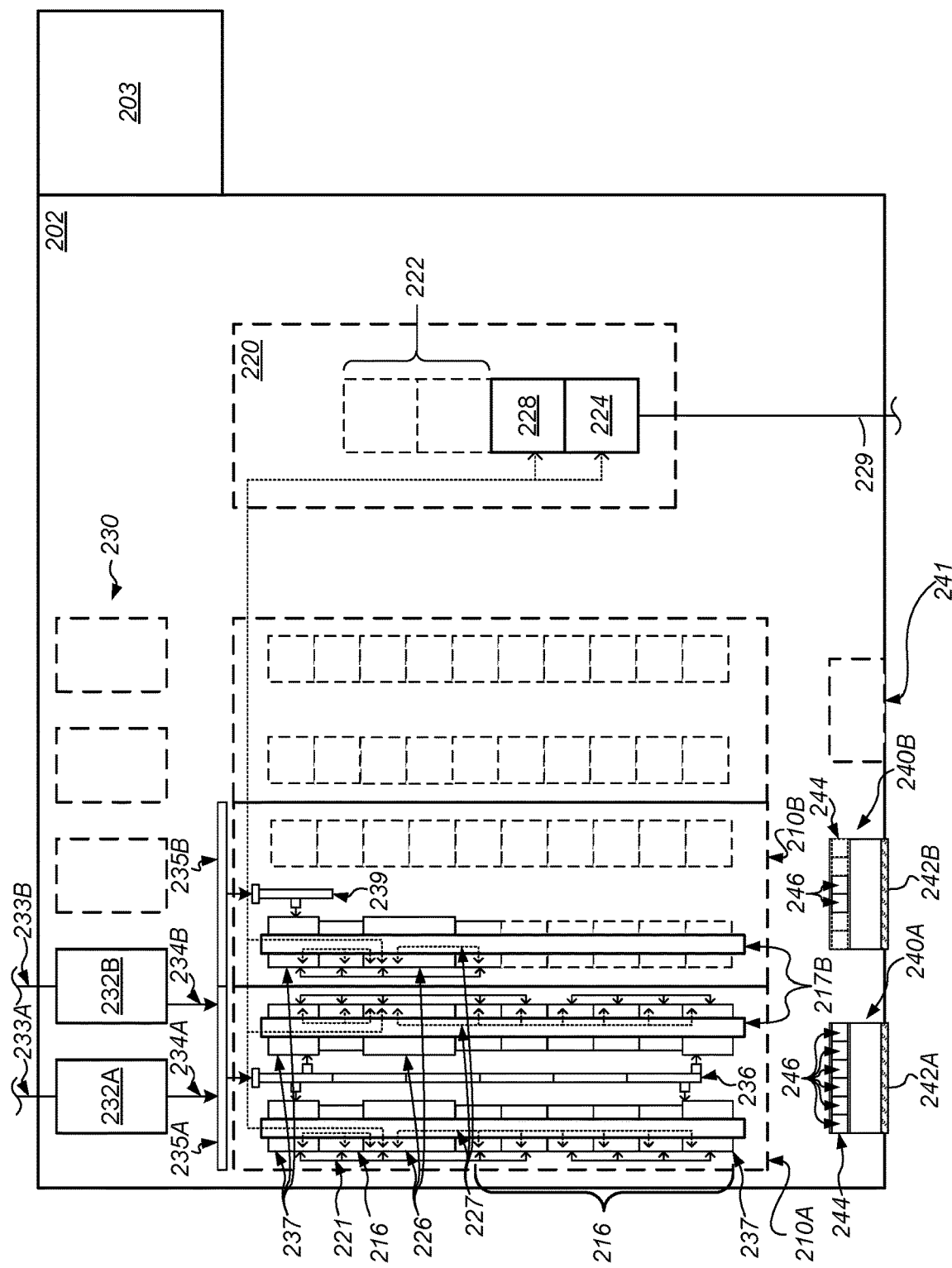

FIG. 2D illustrates data center 200 in a state where additional rack computer systems 216 are received at the data center 200 and are installed in a remainder of rack positions 213 in zone 210A, and additional rack computer systems 216 are installed in another zone 210B in the enclosure. Based at least in part upon the installation of additional rack computer systems 216 in the enclosure, additional infrastructure modules are installed to provide incrementally greater amounts of various types of infrastructure support to the rack computer systems.

As shown, additional rack computer systems 216 are installed in zone 210A. based at least in part upon the support requirements of the rack computer systems, additional network switch devices 226, patch cabling 227, ATS assemblies 237, and branch circuits 221 are installed in the zone 210A to provide power distribution support and network communication support, respectively to the rack computer systems 216 in zone 210A. In addition, additional busway segments are coupled to busway assembly 236 to extend the assembly 236 through the entirety of zone 210A and to electrically couple with the various ATS assemblies 237 installed in the zone 210A.

Because the installation of additional rack computer systems 216 in zone 210A can increase the power support requirement of the data center 200 beyond the support capacity of electrical power modules 232A alone, an additional electrical power modules 2332B can be installed and coupled to busway assembly 235, so that electrical power support capacity is provided by the combined power feeds 234A-B of modules 232A-B via busway assembly 235. As further shown, because electrical loads, including rack computer systems 216, network switches 226, and ATS assemblies 237, are installed in zone 210B, additional busway segment 235B is coupled to busway segment 235A to extend assembly 235 to zone 210B, so that a new aisle busway assembly 239 can be installed in zone 210B and coupled to busway segment 235B to enable distribution of electrical power from modules 232A-B to electrical loads in zone 210B, in addition to distribution to electrical loads in zone 210A.

Because the installation of additional rack computer systems 216 in zone 210A and 210B can increase the cooling support requirement of the data center 200, additional air handling modules 246 are installed in the ports 244 of air handling array 240A. Because the installation of additional rack computer systems can increase the cooling support requirement beyond the support capacity of an array 240A where all ports are occupied by air handling modules 246, an additional air handling array 240B can be installed in the data center enclosure 202, and one or more air handling modules 246 can be installed in one or reo ports 244 of the additional array 240B, to provide additional cooling support to the enclosure 202. As shown, each separate array 240A-B can include a separate air intake 242A-B. In some embodiments, the various arrays 240A-B receive air from a common intake.

Because the installation of additional rack computer systems 216 in zone 210A and 210B can increase the network communication support requirement of the data center 200, additional network zone components 228, which can include one or more router devices, switch devices, etc., are installed in one or more positions 222 in the network zone 220 and communicatively coupled to the rack computer system 216 via one or more instances of cabling infrastructure. In addition, as shown, additional network switch devices, communication cabling, etc. can be installed to provide sufficient network support capacity to support computing operations by installed rack computer systems. In addition, as shown, additional structural support infrastructure modules, including cable trays 217B, can be installed to provide structural support associated with additional rack computer systems installed in additional rows and zones of the enclosure 202.

In some embodiments, incremental installation of various types of infrastructure support in a data center, based at least in part upon incremental installation of various infrastructure modules configured to provide said types of infrastructure support in the data center, can result in rapid deployment of infrastructure capacity in a data center and can, in some embodiments, result in rapid deployment of computing capacity at a data center site. For example, incremental installation of one or more particular types of infrastructure support modules can enable rapid installation of a full support capacity of that particular type of infrastructure at a data center within a relatively short period of elapsed time, so that full computing capacity at the data center can similarly be reached within a relatively short period of elapsed time. Such a relatively short period of elapsed time can include a period of 12 weeks from initiating incremental installation of one or more types of infrastructure support at a data center site which lacks such types of infrastructure support to achieving full support capacity, at the data center site, for said one or more types of infrastructure support.

As used herein, "full support capacity" with reference to one or more types of infrastructure support can refer to a support capacity of the one or more types of infrastructure which is sufficient to support computing operations by an entirety of rack computer systems installed at a data center site when an entirety of rack positions at the data center hall are occupied by one or more instances of equipment, including one or more of rack computer systems, network switch devices, ATS devices, etc. For example, where every rack position 213 in enclosure 202 is occupied by one or more instances of equipment, including rack computer systems 216, the support capacity of each particular type of infrastructure support can be referred to as the full support capacity of that particular type of infrastructure support in the enclosure.

Figure 3:
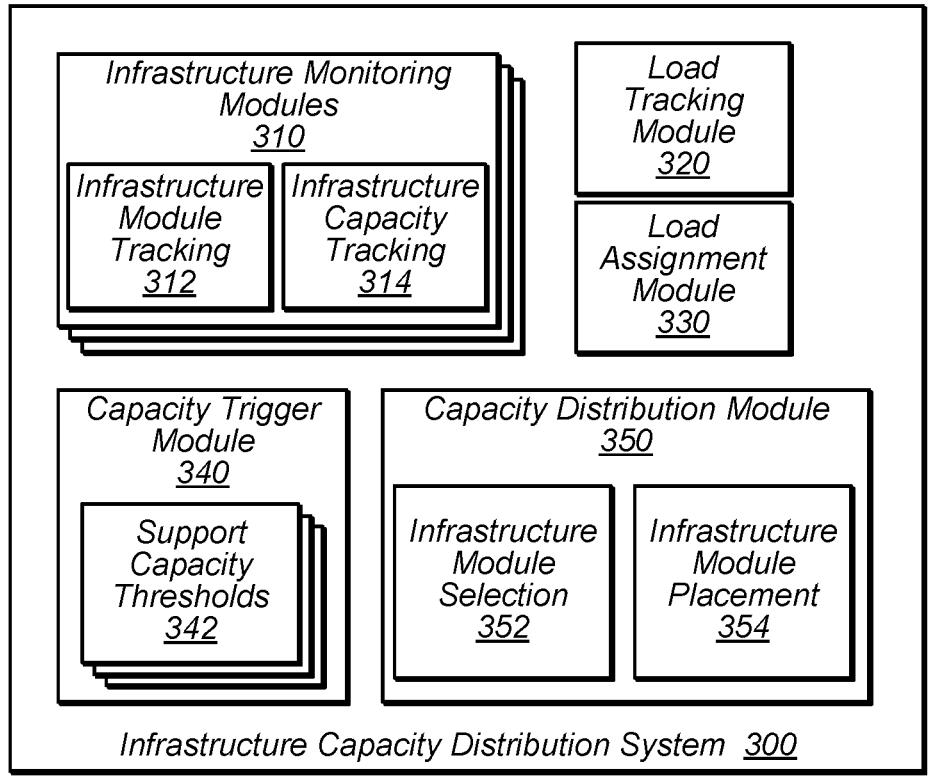
FIG. 3 is a schematic diagram illustrating an infrastructure capacity distribution system, according to some embodiments.

FIG. 3 is a schematic diagram illustrating an infrastructure capacity distribution system, according to some embodiments.

In some embodiments, an infrastructure capacity distribution system 300, also referred to herein as simply a "distribution system", comprises one or more sets of modules configured to implement one or more elements of managing infrastructure capacity in one or more data centers. The various modules in the distribution system, in some embodiments, are implemented by one or more computer systems. Such an infrastructure capacity distribution system, in some embodiments, is included in one or more of capacity distribution system 190, capacity deployment system 180, etc.

Distribution system 300 includes one or more infrastructure monitoring modules 310. Each separate infrastructure monitoring module 310 is configured to monitor a particular type of infrastructure support provided by one or more particular corresponding sets of infrastructure modules in one or more data centers. Such infrastructure modules, data centers, etc., in some embodiments, include one or more of the modules, data center, etc. illustrated in one or more of FIG. 1-2. For example, one infrastructure monitoring module 310 is configured to monitor power support provided by one or more electrical power modules 232 and power line infrastructure modules 235 to one or more electrical loads in one or more data centers 200. As shown, each infrastructure monitoring module 310 can include an infrastructure module tracking module 312 and an infrastructure capacity tracking module 314.

An infrastructure module tracking module 312 can monitor one or more sets of infrastructure modules which provide the particular type of infrastructure support corresponding to the respective module 310. Monitoring one or more sets of infrastructure modules can include monitoring the identity and positions in a data center occupied by the various sets of infrastructure modules, including identifying the available positions in the data center into which additional infrastructure modules of the one or more sets can be installed. For example, a tracking module 312 can maintain a database of infrastructure modules configured to provide a particular type of infrastructure support, where the database indicates the identity and installed location of the various infrastructure modules in the data center.

An infrastructure capacity tracking module 314 can monitor the amount of infrastructure support which can be provided by the various sets of infrastructure modules configured to provide a particular type of infrastructure support. Such an amount of support can be referred to as the support "capacity" of the sets of infrastructure modules for the particular type of infrastructure support. In some embodiments, tracking module 314 tracks usage of the provided type of infrastructure support by electrical loads installed in the data center to determine, at any given time, the excess support capacity of a particular type of infrastructure support in the data center beyond the support requirements or usage of electrical loads which are installed, inbound for installation, one some combination thereof, or the like. In some embodiments, tracking module 314 tracks the support requirements of the installed electric al loads, including rack computer systems, other infrastructure modules, etc. for the particular type of infrastructure support. Such support requirements can be different from the actual usage of the particular type of infrastructure support at one or more times.

As shown, distribution system 300 can include multiple infrastructure monitoring modules 310, each including one or more modules 312, 314, where each separate monitoring module 310 is configured to monitor a separate particular type of infrastructure support. For example, one module 310 can be configured to monitor infrastructure modules and support capacity corresponding to electrical power support, another module 310 can be configured to monitor infrastructure modules and support capacity corresponding to cooling support, etc.

In some embodiments, distribution system 300 includes a load tracking module 320 configured to determine whether one or more electrical loads are inbound for installation in a data center. Such a determination can be based at least in part upon a notification received at system 300 from an external source, which can include a computing capacity deployment system. Such a notification can, in some embodiments, include an indication that one or more particular rack computer systems are inbound for installation in a data center. As noted above, an "inbound" rack computer system can include a rack computer system that has been ordered for delivery, is presently being delivered via one or more modes of transportation, is received at the data center, etc. Load tracking module 320 can determine one or more support requirements of each of the separate inbound rack computer systems, including power requirements, cooling requirements, network communication support requirements, etc. Such a determination can be based at least in part upon specification information associated with each separate inbound rack computer system, and the specification information can be included in the indication. In some embodiments, the specification information associated with a plurality of various types of rack computer systems is stored in a database, and module responds to a notification that one or reo rack computer systems of one or various particular types, are inbound for installation in a data center by accessing the database to determine the support requirements of the inbound rack computer systems for each of various particular types of infrastructure support. Based at least in part upon the support requirements of each individual inbound rack computer system for each particular type of infrastructure support, module 320 can determine the total support requirements of each of the particular types of infrastructure support for the total inbound rack computer systems.

Distribution system 300 can include a load assignment module 330 which is configured to determine one or more particular positions in the data center to which to assign the one or more inbound rack computer systems for installation. Module 330 may select particular available rack positions based at least in part upon the quantity of additional infrastructure modules which would be required to support a rack computer system at the available rack position. Module 330 can assign inbound rack computer systems to particular available rack positions based at least in part upon a determination that assigning the inbound rack computer systems to the particular available rack positions results in a minimum quantity of additional installed infrastructure modules.

Distribution system 300 can include a capacity trigger module 340 which determines whether a support capacity threshold corresponding to a particular type of infrastructure support is at least met or crossed. Based at least in part upon a particular threshold associated with a particular type of infrastructure support being met or crossed, module 340 can determine that one or more infrastructure modules configured to provide the respective type of infrastructure support are to be selected and installed in a data center to increase the support capacity of that type of infrastructure support by at least a certain amount. As shown, capacity trigger module 340 includes multiple support capacity thresholds 342 which each correspond to a separate type of infrastructure support. Each threshold indicates a minimum amount of available support capacity of a particular type of infrastructure support permitted in a data center without installing additional infrastructure modules to increase the support capacity. In some embodiments, a support capacity threshold indicates a minimum permitted excess support capacity of a type of infrastructure support permitted in a data center, beyond one or more of the usage or support requirements of the installed electrical loads, inbound electrical loads, some combination thereof, or the like. For each particular type of infrastructure support, module 340 can compare the present support capacity of that type of infrastructure support with a corresponding support capacity threshold associated with the type of infrastructure support to determine if the present support capacity at least meets or crosses the threshold. The present support capacity can include the difference between the total support capacity of the presently-installed infrastructure modules configured to provide the particular type of infrastructure support and the support requirements of the presently-installed electrical loads, inbound electrical loads, some combination thereof, or the like. In some embodiments, the present support capacity is the excess support capacity of the installed infrastructure modules beyond the support requirements, support usage, etc. of the presently installed electrical loads, inbound loads, some combination thereof, or the like.

Distribution system 300 includes a capacity distribution module 350 configured to select one or more particular infrastructure modules and command installation of the selected infrastructure modules to change the support capacity of one or more particular types of infrastructure support in a data center. Module 350 can select infrastructure modules configured to provide one or more particular types of infrastructure support based at least in part upon a determination that one or more corresponding support capacity thresholds associated with the particular types of infrastructure support are at least met or crossed.

Capacity distribution module 350 includes an infrastructure module selection module 352. Module 352 is configured to select a particular quantity of a particular set of infrastructure modules configured to provide a particular type of infrastructure support. The particular quantity selected can be based at least in part upon the particular amount of support of the particular type of infrastructure support that the individual and collective selected infrastructure modules are configured to provide, the difference between the presently-installed infrastructure module support capacity and the support requirements of the presently-installed electrical loads, the inbound electrical loads, some combination thereof, or the like. For example, where the cooling support capacity of presently installed air handling modules in a data center is determined to meet a cooling support threshold, for example based at least in part upon a determination that the excess support provided by the installed air handling modules beyond the cooling support requirements of both the presently installed rack computer systems and one or more inbound rack computer systems is no more than a certain threshold value, module 352 can respond with a selection of a certain quantity of air handling modules which collectively provide an amount of cooling support which, in combination with the presently-installed air handling module support capacity, increases the cooling support capacity in the data center above a certain threshold value. The quantity of infrastructure modules selected for a particular type of infrastructure can be a minimum quantity needed to raise the support capacity above a certain threshold value.

Capacity distribution module 350 includes a module placement module 354 which selects a position in a data center into which to install the infrastructure modules selected by module 352. Module 354 may select a position in which to install one or more selected infrastructure modules based at least in part upon the various instances of infrastructure needed to enable the selected infrastructure modules to support electrical loads from a given position. For example, an electrical power module configured to distribute electrical power to electrical loads in a data center may require access to power line infrastructure to distribute the electrical power. As a result, a position in the data center in which to place an additional electrical power module can be based at least in part upon the additional amount of power line infrastructure modules needed to electrically couple the electrical power module to the electrical loads in the data center from the given position.

In some embodiments, module 354 generates one or more output signals to command installation of the various selected infrastructure modules in the various selected positions in which the selected infrastructure modules are to be installed. For example, module 354 can generate a message to one or more infrastructure module suppliers, including vendors, inventory management systems, etc. to deliver the selected quantity of the selected infrastructure modules to a data center for installation. Such a message can include a message to an inventory site, including a third-party inventory storage site, to deliver one or more infrastructure modules stored at the site. A message to an inventory site, including one or more of a remote inventory site, local inventory site, etc. to deliver one or more stored infrastructure modules can include a command to said inventory site to replenish the stored inventory of said infrastructure modules, so that the inventory site remains ready to provide additional infrastructure modules in response to future messages from module 354. In some embodiments, module 354 can generate a message to an operator associated with a data center identifying the selected infrastructure modules, the selected positions in which to install the selected modules, and commanding the operator to install the identified modules in the identified positions in the data center.

Figure 4:
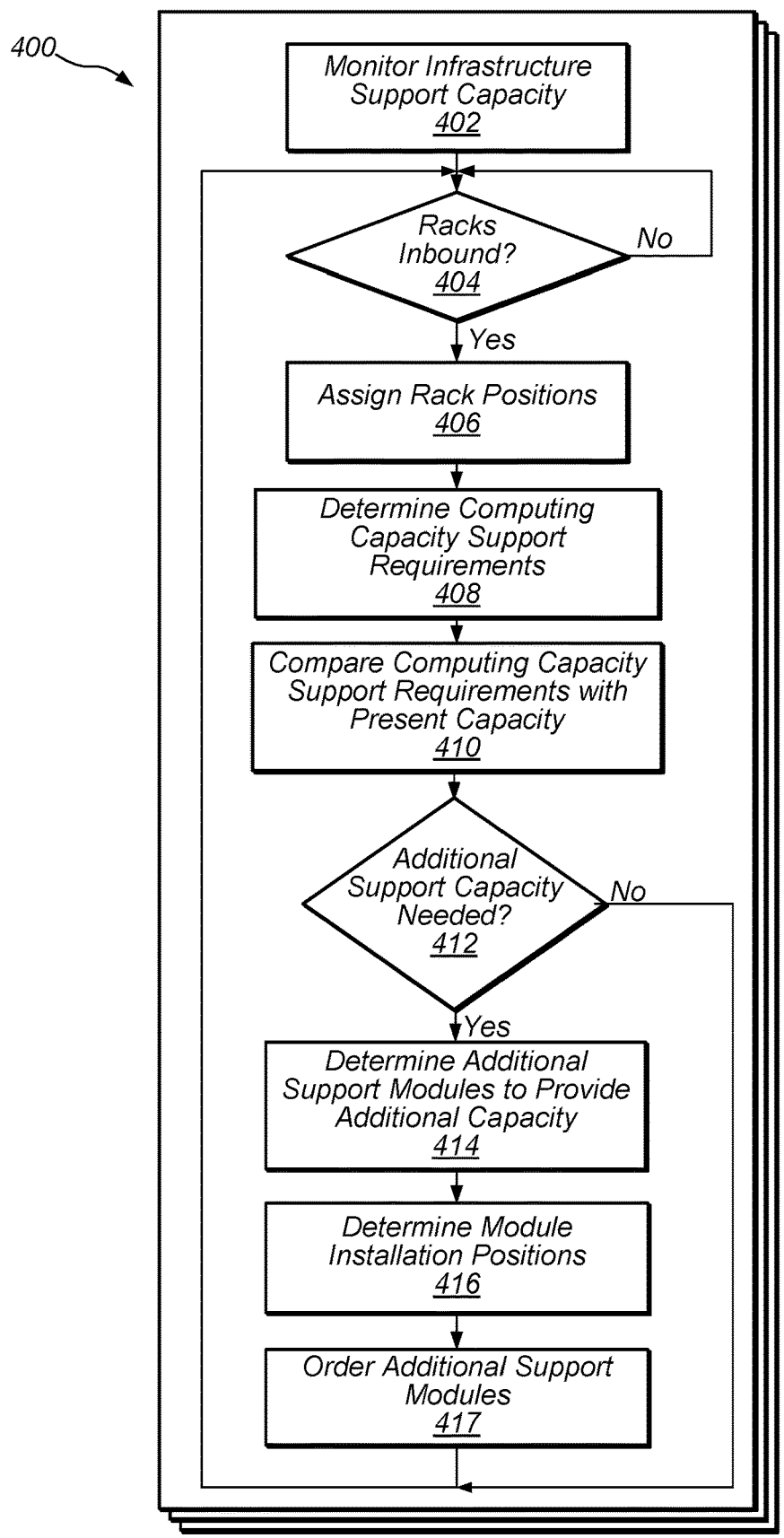
FIG. 4 illustrates incrementally adjusting various sets of infrastructure modules to incrementally adjust various types of infrastructure support in a data center, according to some embodiments.
Figure 5:
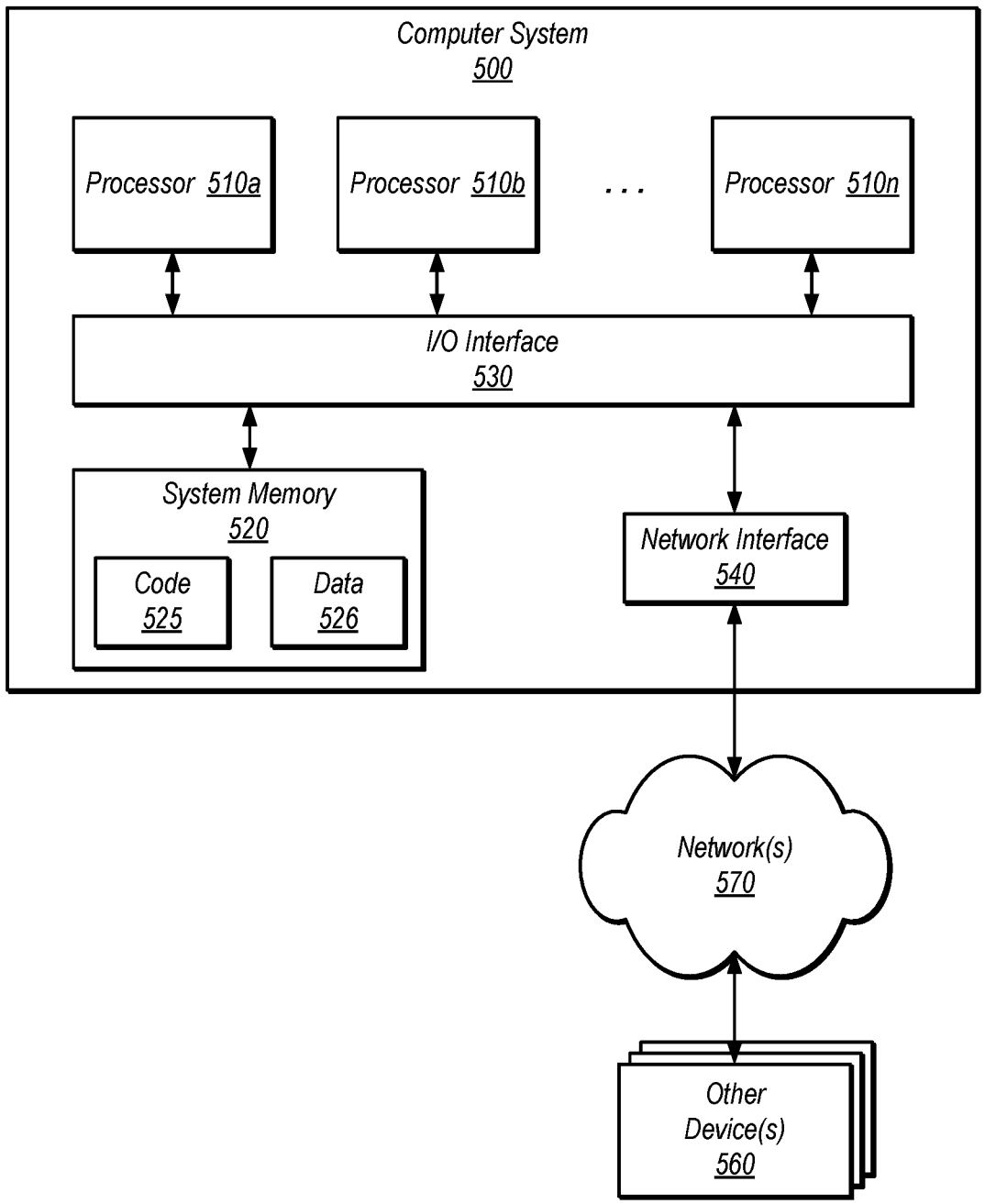
FIG. 5 is a block diagram illustrating an example computer system that may be used in some embodiments.

FIG. 4 illustrates incrementally adjusting various sets of infrastructure modules to incrementally adjust various types of infrastructure support in a data center, according to some embodiments. Such incremental adjustment 400 can be implemented by one or more various disclosed systems, including some or all of the control systems illustrated in FIG. 1, FIG. 3, etc., some or all of one or more computer systems as illustrated in FIG. 5, some combination thereof, or the like.

In some embodiments, multiple instances of the illustrated incremental adjustment 400 are implemented concurrently and independently of each other. Each instance of the incremental adjustment can correspond to a particular type of infrastructure support, a particular set of infrastructure modules, etc. For example, one instance of incremental adjustment 400 of sets of electrical power modules to incrementally adjust electrical power support in a data center can be implemented concurrently and independently of another instance of incremental adjustment 400 of sets of air handling modules to incrementally adjust cooling support in the data center and another instance of incremental adjustment 400 of sets of network communication modules to incrementally adjust network communication support in the data center. It will be understood that various instances of incremental adjustment 400 can include various combinations and portions of the blocks illustrated in FIG. 4. For example, in some embodiments, one or more instances of incremental adjustment 400 include blocks 402, 408-417 and do not include at least blocks 404-406, such that the instance includes monitoring support capacity, support requirements, etc. relative to one or more particular types of infrastructure support and determining and ordering additional support modules if additional capacity is needed based at least in part upon a comparison of present support capacity with present support requirements for a given type of infrastructure support. Each instance of incremental adjustment 400 can include a separate set of capacity "triggers" associated with a separate type of infrastructure support, type of infrastructure module, etc. which are associated with determining that additional support capacity for the given type of infrastructure support is needed. In addition, separate instances of incremental adjustment can operate at different times, and in response to different event triggers. For example, some instances 400 can be implemented continuously, where present support capacity of certain types of infrastructure support can be continuously compared with present support requirements of presently installed and inbound electrical loads for those certain types of infrastructure support, some instances 400 can be implemented to compare support capacity of one or more types of infrastructure support to support requirements of installed and inbound electrical loads for the one or more types of infrastructure support in response to determinations that one or more instances of electrical loads are inbound, etc.

At 402, one or more instances of infrastructure support capacity in a data center are monitored. Each instance of support infrastructure capacity can include the capacity of one or more sets of infrastructure modules, installed in the data center, which are configured to provide a particular type of infrastructure support. For example, the electrical power support capacity associated with a set of electrical power modules in a data center, which can refer to the amount of electrical power which can be distributed by the installed electrical power modules to various installed components in the data center, can be monitored. Such monitoring can include interactive communication between a control system and one or more of the infrastructure modules to enable receipt of infrastructure module information at the control system, where the information identifies the various infrastructure modules, the individual support capacity associated with each separate module in the set of modules, the location in the data center at which each individual infrastructure module is installed, etc. In some embodiments, some or all of such information can be received at a control system via manual operator input.

In some embodiments, multiple separate instances of infrastructure support capacity can be concurrently and independently monitored, where each instance associated with the capacity of a separate set of infrastructure modules to provide a separate type of infrastructure support. For example, electrical power support capacity associated with a set of electrical power modules in a data center, cooling support capacity associated with a set of air handling modules in the data center, and networking capacity associated with a set of network support modules in the data center can each be concurrently and independently monitored by one or more control systems.

In some embodiments, each instance of support capacity being monitored is monitored in relation to present support requirements associated with the particular type of infrastructure support, present consumption thereof, etc. of the various components installed in the data center. In some embodiments, a monitored instance of support capacity includes the excess support capacity beyond the present support requirements of the installed electrical loads for that particular type of infrastructure support. For example, an electrical power support capacity being monitored by a control system can include an excess electrical power support which can be provided by the presently-installed electrical power modules beyond the present electrical power requirements of the installed rack computer systems, infrastructure modules, etc. in the data center.

Monitoring an instance of support capacity can include monitoring both the support capacity of an installed set of infrastructure modules, present support requirements of installed and inbound electrical loads, and determining whether a difference between the two is less than a predetermined threshold amount. For example, monitoring electrical power support capacity can include determining whether the present support capacity exceeds the total support requirements of both the presently-installed electrical loads and the support requirements of electrical loads that are presently inbound for installation at the data center.

At 404, a determination is made regarding whether one or more rack computer systems are presently inbound for installation. Such a determination can be made based at least in part upon receiving a notification that one or more rack computer systems are presently inbound for installation. Such a notification can include various information associated with the inbound rack computer systems, including manufacturer, type, etc. The information can include various specifications for the individual inbound rack computer systems, for a set of inbound rack computer systems, etc. Such specifications can include support requirements, for each of one or more types of infrastructure support, for one or more particular inbound rack computer systems. For example, a notification that three rack computer systems are inbound for installation can include support requirements for each of the three rack computer systems, as well as total support requirements of the three inbound rack computer systems, for each of multiple separate types of infrastructure support. A "presently inbound" rack computer system can include a rack computer system which has been ordered for delivery to the data center, a rack computer system which is presently inbound via one or more various modes of transportation, etc. Delivery via one or more various modes of transportation can include delivery via one or more delivery trucks, aircraft, watercraft, etc.

In some embodiments, a notification indicates that one or more inbound rack computer systems are inbound to replace one or more presently-installed rack computer systems in one or more positions in the data center. Such a notification can include an identification of the one or more presently-installed rack computer systems that are to be replaced by the inbound rack computer systems.

At 406, one or more particular available rack positions in the data center are assigned to the one or more inbound rack computer systems. An available rack position may be selected based at least in part upon an amount of support infrastructure required to support a rack computer system in the given rack position. For example, the amount of additional support infrastructure, including cabling infrastructure, power infrastructure modules, etc. required to be installed in the data center to provide support to a rack computer system in one or more of multiple available rack positions in the data center may be determined, and a rack position may be assigned based at least in part upon a determination that the additional quantity of one or more particular sets of infrastructure modules required to be installed to support computing operations by the particular rack computer system at the rack position is less than the additional quantity of the one or more one or more particular sets of infrastructure modules required to be installed to support computing operations by the particular rack computer system at some or all of the remainder rack positions in the data center. For example, where a data center includes a row of rack positions, and some of the rack positions are already occupied by installed rack computer systems, network switch devices, etc., and power busways are already installed to extend along the portion of the row which includes installed rack computer systems, inbound rack computer systems may be assigned to available rack positions which are adjacent to the occupied rack positions, as the quantity of additional power busways required to be installed in the data center to support rack computer systems in the adjacent rack positions may be less than the quantity of power busways required to be installed to support rack computer systems installed in rack positions at a distal end of the row from the occupied rack positions. In some embodiments, the quantity of additional infrastructure modules, of one or more particular sets of infrastructure modules, required to support inbound rack computer systems is the same regardless of which rack position in which such rack computer systems are installed. For example, as air handling modules provide cooling support to the data center as a whole, the quantity of additional air handling modules required to support a rack computer system at any given available rack position in the data center may be the same.

At 407, the installation of various types of infrastructure modules, to provide various types of infrastructure support, in the data center are managed based at least in part upon a comparison of the present support capacity associated with a given type of infrastructure support with present support requirements, support utilization, etc. of presently installed electrical loads in the data center, presently inbound electrical loads, some combination thereof, or the like. Such management can include, for each individual type of infrastructure support, independently managing incremental installation of incremental amounts of additional support capacity, based at least in part upon such a comparison for that particular type of infrastructure support. Such management can include the use of capacity "triggers", based at least in part upon the above-discussed support capacity monitoring, which triggers selection and installation of a particular quantity of a particular set of infrastructure modules to provide a selected incremental amount of a particular type of infrastructure support.

The following illustration, in FIG. 4, of infrastructure support management 407 discusses concurrent and independent management of various types of infrastructure support, via concurrent and independent management of various separate sets of infrastructure modules which are each configured to provide different types of infrastructure support. Such management can be implemented, for different types of infrastructure support, at different times, concurrently, in response to one or more various determinations regarding separate types of infrastructure support, in response to one or more various "triggers" associated with various types of infrastructure support, in response to one or more determinations regarding inbound electrical loads, some combination thereof, etc.

At 408, the computing capacity support requirements of the inbound rack computer systems are determined. Such determination can be based at least in part upon information included in a notification that the rack computer systems are presently inbound. Where the notification specifies a particular manufacturer and model of each inbound rack computer system, the determination can include identifying support requirements, for one or more various types of infrastructure support, for each of the inbound rack computer systems from an entry, in a local database of support requirements, associated with the identified manufacturer and model of the inbound rack computer system. In some embodiments, the notification specifies, for one or more of the inbound rack computer systems, support requirements for one or more particular types of infrastructure support.

In some embodiments, determination of the computing capacity support requirements of the inbound rack computer systems includes determining a total computing capacity support requirement, for each of multiple types of infrastructure support, of both the presently-installed rack computer systems and the inbound rack computer systems. In some embodiments, the determination includes determining an additional capacity support requirement, for each of multiple types of infrastructure support, of the inbound rack computer systems.

In some embodiments, where one or more inbound rack computer systems are indicated to be replacing one or more presently-installed rack computer systems, determination of the computing capacity support requirements of the inbound rack computer systems, for one or more particular types of infrastructure support, includes determining a difference, for a given types of infrastructure support, between the support requirements of the inbound rack computer systems and the support requirements of the presently-installed rack computer systems that are to be replaced. Such a difference can be a negative value, indicating that replacing the presently-installed rack computer systems with the inbound rack computer systems will result in an increase in the present excess support capacity for the given type of infrastructure support.

At 410, for each of multiple various types of infrastructure support, the determined support capacity requirements are compared with the presently-installed support capacity of one or more sets of infrastructure modules to provide that particular type of infrastructure support. Such a comparison can include, for one or more particular types of infrastructure support, comparing the present excess support capacity, for that particular type of infrastructure support, of one or more sets of installed infrastructure modules with a total support requirement, for that particular type of infrastructure support, of the inbound rack computer systems. In some embodiments, the total support capacity of the installed sets of infrastructure modules to provide a particular type of infrastructure support is compared with a total support requirement of both the installed rack computer systems and the inbound rack computer systems.

In some embodiments, a comparison of support requirements with present support capacity, for one or more types of infrastructure support, includes comparing a difference between the two with a threshold value. In some embodiments, the threshold value is equality between presently-installed support capacity and the total support requirements of presently-installed and presently-inbound electrical loads. For example, a threshold value for a given type of infrastructure support can be determined to be exceeded if the support requirements of presently-inbound rack computer systems, for that particular type of infrastructure support, exceed the excess support capacity of the presently-installed infrastructure modules configured to provide that particular type of infrastructure support. In some embodiments, the threshold value is a certain margin value, proportion, etc. beyond such equality. For example, a threshold value for a given type of infrastructure support can be determined to be exceeded if the total support capacity of presently-installed infrastructure modules configured to provide a particular type of infrastructure is no more than 110% of the support total support requirements of both presently installed rack computer systems and presently-inbound rack computer systems, for that particular type of infrastructure support.

In some embodiments, where one or more inbound rack computer systems are indicated to be replacing one or more presently-installed rack computer systems, the comparison can include comparing the difference between the support requirements of the inbound and presently-installed rack computer systems with the present excess support capacity.

In some embodiments, a computing capacity support requirement associated with electrical power support, herein referred to as an electrical power support requirement, for one or more electrical loads can include an amount of one or more of electrical power, apparent electrical power, current, voltage required to support operations by the one or more electrical loads. For example, an electrical power support requirement for a rack computer system can include one or more of a 20 kilovolt-ampere apparent power requirement, a 15 kilovolt-ampere apparent power requirement, a 10 kilovolt-ampere apparent power requirement an 800 ampere current requirement, etc. Separate individual electrical loads, including separate individual rack computer systems of a set of multiple inbound rack computer systems, can have different individual electrical power support requirements. For example, a set of three inbound rack computer systems can include a rack computer system with a 20 kVA requirement, a rack computer system with a 15 kVA requirement, and a rack computer system with a 10 kVA requirement. In such an example, the total electrical power support requirement of the inbound rack computer systems can include a 45 kVA requirement.

In some embodiments, a computing capacity support requirement associated with electrical power support, herein referred to as an electrical power support requirement, for one or more electrical loads can include a quantity of power line infrastructure modules required to distribute electrical power from one or more electrical power modules to a given position in which a given electrical load is to be installed, and one or more parameters of electrical power which is required to be distributed via the power line infrastructure modules. For example, where an inbound rack computer system is assigned to a particular available rack position in a data center, the electrical power support requirement for the given rack computer system can include the quantity of power line infrastructure modules required to distribute electrical power to the particular available rack position, and a current of electrical power required to be distributed to the rack computer system at the available rack position. An electrical power support requirement for a rack computer system at a given rack position which is located approximately 20 feet in distance from an end of an aisle in a data center can include at least 20 feet of power line infrastructure modules configured to carry 800 A of electrical power. Where each power line infrastructure module includes a 5-foot long power busway segment, the support requirement can include an assembly of at least 4 power busway segments coupled in series and extending from the end of the aisle. An electrical power support requirement for a rack computer system at a rack position in a given aisle which is located approximately 20 feed in distance from an end of the data center can include at least 20 feet of power line infrastructure modules configured to carry electrical power from one or more electrical power modules to at least the end of the given aisle.

In some embodiments, a computing capacity support requirement associated with cooling support, herein referred to as a cooling support requirement, for one or more electrical loads can include an amount of one or more of a flow rate of cooling air required to support operations by the one or more electrical loads in the data center. For example, a cooling support requirement for a rack computer system can include a certain flowrate, in terms of cubic feet per minute (CFM), of air at one or more temperatures. Separate individual electrical loads, including separate individual rack computer systems of a set of multiple inbound rack computer systems, can have different individual cooling support requirements, which can include separate individual flowrates of cooling air, while the total cooling support requirement of the set of inbound rack computer systems can be a sum of the individual flowrates associated with the individual rack computer systems.

In some embodiments, a computing capacity support requirement associated with structural support, herein referred to as a structural support requirement, for one or more electrical loads can include a quantity of structural support infrastructure modules required to support operations by the one or more electrical loads. For example, a structural support requirement for a rack computer system can include a single structural infrastructure module which is configured to encompass an incremental portion of an exhaust air plenum, cooling air plenum, a cable tray module configured to support cabling infrastructure routed to at least the single rack computer system, etc.

In some embodiments, a computing capacity support requirement associated with network communication support, herein referred to as a network communication support requirement, for one or more electrical loads can include a quantity of ports, bandwidth, etc. required to communicatively couple installed electrical power with one or more communication networks and enable remote access to the one or more electrical loads. In addition, network communication support requirements can include a quantity of instances of network cabling infrastructure (herein network cabling infrastructure modules) which communicatively couple electrical loads with one or more network communication infrastructure modules to enable remote access to the electrical loads. For example an inbound rack computer system can have a network communication support requirement of 2 network communication ports. Network communication modules can include network switch devices, routers, etc. with a certain number of ports, and comparison of support requirements and support capacity can include comparing the number of ports associated with inbound rack computer systems with the number of available ports on installed network switch devices, routers, etc.

At 412, a determination is made, independently for each of various types of infrastructure support, whether additional support capacity is needed for that particular type of infrastructure support. Such a determination can be based at least in part upon a determination that one or more thresholds associated with a comparison of presently-installed support capacity for that type of infrastructure support with support requirements of one or more of presently-installed electrical loads, inbound electrical loads, etc.

For example, a determination that additional support capacity is needed for a particular type of infrastructure support can include a determination that the excess support capacity (i.e., the support capacity beyond that required to support presently-installed electrical loads) of presently-installed sets of infrastructure modules configured to provide that particular type of infrastructure support is less than the additional support requirements of one or more presently-inbound rack computer systems. In another example, a determination that additional support capacity is needed for a particular type of infrastructure support can include a determination that the total support capacity of presently-installed sets of infrastructure modules configured to provide that particular type of infrastructure support is less than a certain proportion (e.g., 10%) beyond the total support requirements of both presently-installed rack computer systems and inbound rack computer systems. Such determinations can be referred to as a determination of a support capacity "deficit" for that particular type of infrastructure support.

In some embodiments, the determination illustrated at 412 can be implemented, for various types of infrastructure support, concurrently, at different times, etc. The determination can be implemented independently for each of the various types of infrastructure support. For example, a determination regarding each of whether additional electrical power support capacity and additional cooling support capacity is needed in a data center can be implemented concurrently, at different times and in response to different triggers, etc.

At 414, based at least in part upon a determination that additional support capacity is needed for one or more particular types of infrastructure support, a particular quantity of one or more particular infrastructure modules to provide the needed additional capacity is determined. Such a determination of infrastructure modules can be referred to interchangeably herein as a "selection" of a particular quantity of one or more particular sets of infrastructure modules configured to provide a particular type of infrastructure support. Such a determination can be performed independently for each of various types of infrastructure support, so that particular quantities of various sets of infrastructure modules, each set configured to provide a different type of infrastructure support, can be selected independently of each other.

For each separate type of infrastructure support, a determination of additional infrastructure modules can include a determination of an additional amount of support capacity of that particular type of infrastructure support that is needed. The additional amount can, in some embodiments, be associated with a quantity of a determined support capacity "deficit" of that particular type of infrastructure support. In some embodiments, the additional amount of support capacity that is needed is no less than the quantity of the determined deficit. In some embodiments, the additional amount comprises a certain proportion of the determined deficit (e.g., 110% of the determined deficit, an additional amount that, upon installation, would result in the installed support capacity being no less than 110% of the installed and inbound support requirements, etc.).

In some embodiments, a determination of additional infrastructure modules can include identifying one or more sets of infrastructure modules which provide the needed additional support capacity of the particular type of infrastructure support and further identifying the incremental support capacity provided by each infrastructure module in the set. Based at least in part upon a comparison of the incremental support capacity of each infrastructure module and the needed additional support capacity, a quantity of the identified infrastructure modules which provides a total quantity of support capacity which at least meets the needed additional support capacity can be determined.

In some embodiments, a particular quantity of identified infrastructure modules can be selected based at least in part upon the particular quantity being a minimum quantity of such infrastructure modules which provide a total incremental support capacity that at least meets the needed additional support capacity. For example, where an electrical power support capacity deficit is determined for a data center, one or more sets of electrical power modules which are configured to provide electrical power support can be identified, and a particular quantity of electrical power modules which collectively provide a total incremental support capacity which at least meets the quantity of the determined deficit can be identified.

An identified particular quantity of infrastructure modules which are configured to at least meet the deficit can be selected for installation in the data center. Such a selection can include selecting one or more infrastructure modules for installation in the data center from a local inventory in the data center, selecting one or more infrastructure modules for delivery to the data center from a remote inventory site, selecting one or more infrastructure modules for delivery to the data center from one or more infrastructure module suppliers, some combination thereof, or the like. For example, electrical power modules may be stored in a remote inventory site, and a selection of a quantity of electrical power modules can include a selection of a particular set of electrical infrastructure modules stored at a remote inventory site. In another example, air handling module may be stored in a local inventory site at the data center, and a selection of a quantity of air handling module can include selection of a particular set of air handling modules stored in the local inventory. In some embodiments, where infrastructure modules are stored at a remote inventory site and are selected for delivery from said remote inventory site, the remote inventory site can be managed by one or more third-party entities which are separate from one or more entities managing one or more of the data center, infrastructure capacity distribution system, managing one or more suppliers of rack computer systems, managing one or more vendors of infrastructure modules, etc.

At 416, one or more installation positions to which the selected infrastructure modules are to be installed in the data center are selected. Such installation positions may be selected based at least in part upon a determined quantity of additional infrastructure, (e.g., cabling, busways, etc.) required to link the selected infrastructure modules to the electrical loads of the data center from the given installation positions. In some embodiments, one or more installation positions are selected based at least in part upon a determination that installing one or more of the selected infrastructure modules in the one or more installation positions minimizes the additional infrastructure required to link the infrastructure modules to the electrical loads in the data center.

At 417, one or more infrastructure modules are ordered to be installed. Such an order can specify particular infrastructure modules via specifying a particular identification code associated with the particular infrastructure modules. In another example, an order can specify a particular type of infrastructure module and can further specify a particular quantity of such infrastructure modules. Where separate sets of infrastructure modules are selected, to provide separate types of infrastructure support to meet separate support capacity deficits, an order may specify multiple separate sets of infrastructure modules, and respective quantities thereof. Such an order can, in some embodiments, identify particular installation positions to which each of the selected infrastructure modules are to be installed in the data center. Various orders can be generated for various different recipients. For example, a particular order for a supplier of electrical power modules can specify a particular type of electrical power module, and quantity thereof, and command delivery of the identified quantity of the electrical power modules to a particular data center. In another example, an order generated for transmission to an operator associated with a data center, including an order associated with infrastructure modules stored at a local inventory, can include a specification of particular stored infrastructure modules, based on identification codes associated with each stored infrastructure module, and can specify a particular installation position in the data center to which each particular infrastructure module is to be installed. Where an order message is generated for an off-site supplier, remote inventory, etc., an additional message can be generated for an on-site operator which specifies particular infrastructure modules that are inbound for installation in the data center, and further specifies particular installation positions in the data center to which the inbound infrastructure modules are to be installed.

FIG. 5 is a block diagram illustrating an example computer system that may be used in some embodiments.

In some embodiments, a system that implements a portion or all of one or more of the technologies, including but not limited to a portion or all of infrastructure module distribution management, infrastructure support capacity monitoring, and various infrastructure management methods, systems, devices, and apparatuses as described herein, may include a general-purpose computer system that includes or is configured to access one or more computer-accessible media, such as computer system 500 illustrated in FIG. 5. In the illustrated embodiment, computer system 500 includes one or more processors 510 coupled to a system memory 520 via an input/output (I/O) interface 530. Computer system 500 further includes a network interface 540 coupled to I/O interface 530.

In various embodiments, computer system 500 may be a uniprocessor system including one processor 510, or a multiprocessor system including several processors 510 (e.g., two, four, eight, or another suitable number). Processors 510 may be any suitable processors capable of executing instructions. For example, in various embodiments, processors 510 may be general-purpose or embedded processors implementing any of a variety of instruction set architectures (ISAs), such as the x86, PowerPC, SPARC, or MIPS ISAs, or any other suitable ISA. In multiprocessor systems, each of processors 510 may commonly, but not necessarily, implement the same ISA.

System memory 520 may be configured to store instructions and data accessible by processor(s) 510. In various embodiments, system memory 520 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing one or more desired functions, such as a portion or all of infrastructure module distribution management, infrastructure support capacity monitoring, and various infrastructure management methods, systems, devices, and apparatuses as described herein, are shown stored within system memory 520 as code 525 and data 526.

In one embodiment, I/O interface 530 may be configured to coordinate I/O traffic between processor 510, system memory 520, and any peripheral devices in the device, including network interface 540 or other peripheral interfaces. In some embodiments, I/O interface 530 may perform any necessary protocol, timing or other data transformations to convert data signals from one component (e.g., system memory 520) into a format suitable for use by another component (e.g., processor 510). In some embodiments, I/O interface 530 may include support for devices attached through various types of peripheral buses, such as a variant of the Peripheral Component Interconnect (PCI) bus standard or the Universal Serial Bus (USB) standard, for example. In some embodiments, the function of I/O interface 530 may be split into two or more separate components, such as a north bridge and a south bridge, for example. Also, in some embodiments some or all of the functionality of I/O interface 530, such as an interface to system memory 520, may be incorporated directly into processor 510.

Network interface 540 may be configured to allow data to be exchanged between computer system 500 and other devices 560 attached to a network or networks 550, such as other computer systems or devices as illustrated in FIGS. 1 through 4, for example. In various embodiments, network interface 540 may support communication via any suitable wired or wireless general data networks, such as types of Ethernet network, for example. Additionally, network interface 540 may support communication via telecommunications/telephony networks such as analog voice networks or digital fiber communications networks, via storage area networks such as Fibre Channel SANs, or via any other suitable type of network and/or protocol.

In some embodiments, system memory 520 may be one embodiment of a computer-accessible medium configured to store program instructions and data for implementing embodiments of infrastructure support management methods as described above relative to FIGS. 1-4. In other embodiments, program instructions and/or data may be received, sent or stored upon different types of computer-accessible media. Generally speaking, a computer-accessible medium may include non-transitory storage media or memory media such as magnetic or optical media, e.g., disk or DVD/CD coupled to computer system 500 via I/O interface 530. A non-transitory computer-accessible storage medium may also include any volatile or non-volatile media such as RAM (e.g. SDRAM, DDR SDRAM, RDRAM, SRAM, etc.), ROM, etc., that may be included in some embodiments of computer system 500 as system memory 520 or another type of memory. Further, a computer-accessible medium may include transmission media or signals such as electrical, electromagnetic, or digital signals, conveyed via a communication medium such as a network and/or a wireless link, such as may be implemented via network interface 540.

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, volatile or non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A method of providing just in time compute capacity and infrastructure capacity at a data center, the method comprising:
   incrementally installing one or more infrastructure modules configured to provide infrastructure support to rack computer systems for a portion of rack positions of an aisle of the data center, wherein other rack positions of the aisle of the data center are not initially filled with rack computer systems, and wherein the one or more infrastructure modules have infrastructure support capacities minimally sufficient to provide infrastructure support to the rack computer systems for the portion of the rack positions of the aisle;
   incrementally installing the rack computer systems in the portion of the rack positions of the aisle;
   performing computing operations using the incrementally installed rack computer systems;
   while performing the computing operations:
      incrementally installing one or more additional infrastructure modules configured to provide infrastructure support to additional rack computer systems for positions of the aisle, wherein the one or more additional infrastructure modules have infrastructure support capacities minimally sufficient to provide infrastructure support to the additional rack computer systems for the rack positions of the aisle; and
      incrementally installing the additional rack computer systems in the rack positions of the aisle; and
   performing computing operations using the incrementally installed rack computer systems and the additional incrementally installed rack computer systems.

2. The method of claim 1, wherein the one or more additional infrastructure modules are concurrently installed in the data center with the additional rack computer systems.

3. The method of claim 1, wherein the one or more additional infrastructure modules comprise one or more of:
   a sub-aisle length power busway segment configured to couple with one or more other sub-aisle length power busway segments to supply power to the additional rack computer systems;
   an electrical power module comprising one or more of: a utility transformer, a backup power system, a switching device, an uninterruptible power supply (UPS), or a power distribution unit (PDU), each mounted on a common substructure, wherein the electrical power module constitutes a skid configured to be installed as a single unit, and wherein the electrical power module is configured to provide electrical power support capacity to the additional rack computer systems;
   an air handling module, wherein the air handling module is configured to provide an incremental amount of cooling air flow in the aisle to provide an incremental amount of cooling support for the additional rack computer systems;
   a network communication module configured to communicatively couple the additional rack computer systems to one or more communication networks to provide an incremental amount of network communication support; or
   a structural support module configured to be installed in the aisle to provide incremental structural support comprising:
      one or more instances of cabling infrastructure or one or more air plenums,
   to support the additional rack computer.

4. The method of claim 3, wherein incrementally installing the one or more additional infrastructure modules comprises:
   independently installing the sub-aisle length power busway segment or the electrical power module in the aisle without concurrently installing the air handling module in the aisle, without concurrently installing the networking module in the aisle, and without concurrently installing the structural support module in the aisle.

5. The method of claim 4, further comprising:
   while performing the computing operations using the incrementally installed rack computer systems and the additionally incrementally installed rack computer systems:
      incrementally installing one or more additional ones of the air handling module, the networking module, or the structural support module for the aisle; and
      incrementally installing another set of additional rack computer systems in other positions of the aisle.

6. The method of claim 3, wherein incrementally installing the one or more additional infrastructure modules comprises:
   independently installing the air handling module for the aisle without concurrently installing the sub-aisle length power busway segment or the electrical power module in the aisle, without concurrently installing the networking module in the aisle, and without concurrently installing the structural support module in the aisle.

7. The method of claim 6, further comprising:
   while performing the computing operations using the incrementally installed rack computer systems and the additionally incrementally installed rack computer systems:
      incrementally installing one or more additional ones of the sub-aisle length power busway segment or the electrical power module, the networking module, or the structural support module for the aisle; and
      incrementally installing another set of additional rack computer systems in other positions of the aisle.

8. The method of claim 3, wherein incrementally installing the one or more additional infrastructure modules comprises:
   independently installing the networking module or the structural support module for the aisle without concurrently installing the sub-aisle length power busway segment or the electrical power module in the aisle, and without concurrently installing the air handling module for the aisle.

9. The method of claim 1, further comprising:
   prior to incrementally installing the one or more additional infrastructure modules and the additional rack computer systems:
      determining additional computing capacity is needed to be added to the aisle of the data center;
      determining current infrastructure support capacity of the aisle is insufficient to support the additional computing capacity needed; and
      concurrently ordering for delivery to the data center:
         the one or more additional infrastructure modules to be installed in the aisle; and
         the additional rack computer systems to be installed in the aisle.

10. A data center, comprising:
an aisle space established between adjacent rows of rack positions configured to receive rack computer systems;
rack computer systems installed in a portion of the rack positions of the adjacent rows, wherein other ones of the rack positions of the adjacent rows are unoccupied;
a sub-aisle length power busway segment installed in the aisle adjacent to the portion of the rack positions in which the rack computer systems are installed, wherein the sub-aisle length power busway segment is configured to supply power to the rack computer systems installed in the portion of the rack positions and is further configured to couple with one or more other sub-aisle length power busway segments to supply power to additional rack computer systems to be installed in the future at other rack positions of the adjacent rows;
an electrical power module comprising one or more of: a utility transformer, a backup power system, a switching device, an uninterruptible power supply (UPS), or a power distribution unit (PDU), each mounted on a common substructure, wherein the electrical power module constitutes a skid configured to provide minimally sufficient electrical power support capacity to the rack computer systems installed in the rack positions of the adjacent rows; and
an air handling module, wherein the air handling module is configured to provide a minimally sufficient amount of cooling air flow in the aisle to provide a minimally sufficient amount of cooling support for the rack computer systems installed in the rack positions of the adjacent rows.

11. The data center of claim 10, wherein the aisle and the adjacent rows of rack positions are configured to:
accept installation of additional rack computer systems in respective ones of the unoccupied rack positions while the rack computer systems perform computer operations.

12. The data center of claim 11, wherein:
the sub-aisle length power busway segment is configured to couple with an additional sub-aisle power busway segment that is concurrently installed in the aisle with the additional rack computer systems,
wherein the sub-aisle length power busway segment is configured to supply the power to the rack computer systems installed in the rack positions while being coupled to the additional sub-aisle power busway segment, wherein the additional sub-aisle length power busway is configured to provide power to the additional rack computer systems being installed in the respective ones of the unoccupied rack positions concurrently with installation of the additional sub-aisle power busway segment.

13. The data center of claim 11, wherein:
the air handling module is installed in a port of an air handling array of a fan-wall of the data center associated with the aisle,
wherein the air handling array is configured to accept installation of an additional air handling module that is configured to provide cooling to the additional rack computer systems being installed in the respective ones of the unoccupied rack positions concurrently with installation of the additional air handling module.

14. A system comprising:
one or more computer systems, the one or more computer systems comprising at least one memory storing program instructions and at least one hardware processor configured to execute the program instructions to implement a computing capacity deployment system configured to:
determine whether an incremental amount of computing capacity is to be installed in a data center to satisfy demand for computing capacity; and
one or more other computer systems, the one or more other computer systems comprising at least one memory storing program instructions and at least one hardware processor configured to execute the program instructions to implement an infrastructure capacity distribution system configured to:
determine whether current infrastructure support capacity of an aisle is sufficient to support an additional incremental amount of computing capacity that is to be installed in the aisle;
wherein the computing capacity deployment system and the infrastructure capacity distribution system are configured to concurrently:
order, for delivery to the data center, additional rack computer systems to be installed in one or more rack positions of the aisle to meet an incremental amount of computing capacity that is needed to satisfy the demand for computing capacity; and
order, for delivery to the data center, one or more additional infrastructure modules to be installed in the aisle to provide infrastructure support to the additional rack computer systems.

15. The system of claim 14, wherein the infrastructure distribution system is configured to:
independently determine whether power capacity, cooling capacity, or network capacity of the aisle is sufficient to support the additional incremental amount of computing capacity to be installed in the aisle.

16. The system of claim 15, wherein the infrastructure distribution system is configured to:
determine whether power busway infrastructure of the aisle is sufficient to support the additional rack computer systems to be installed in the one or more rack positions of the aisle; and
in response to determining current power busway infrastructure is not sufficient, order a sub-aisle length power busway segment configured to couple with one or more other sub-aisle length power busway segments to supply power to the additional rack computer systems to be installed in one or more rack positions of the aisle.

17. The system of claim 15, wherein the infrastructure distribution system is configured to:
determine whether cooling infrastructure of the aisle is sufficient to support the additional rack computer systems to be installed in the one or more rack positions of the aisle; and
in response to determining current cooling infrastructure is not sufficient, order an additional air handling module to be installed in an air handling array associated with the aisle, wherein the additional air handling module is configured to provide cooling to the additional rack computer systems to be installed in in the one or more rack positions of the aisle.

18. The system of claim 15, wherein the infrastructure distribution system is configured to:
determine whether networking infrastructure of the aisle is sufficient to support the additional rack computer systems to be installed in the one or more rack positions of the aisle; and in response to determining current networking infrastructure is not sufficient, order an additional network communication infrastructure module to be installed in the aisle, wherein the additional network communication infrastructure module has an incremental support capacity proportional to the incremental amount of computing capacity being installed in the aisle.

19. The system of claim 18, wherein the network communication infrastructure module comprises:
a network switch device to be installed in a row of the aisle, wherein the network switch device is sized to provide networking support to a portion of rack computing systems in rack positons of the row, wherein the rack positions are proximate to a central portion of the row; and
just-in-time cabling having lengths minimally sufficient to connect the network switch device to the rack computing systems in the rack positions of the row.

20. The system of claim 14, further comprising:
one or more computer systems, the one or more computer systems comprising at least one memory storing program instructions and at least one hardware processor configured to execute the program instructions to implement a load tracking module configured to:
determine when the additional rack computer systems are inbound for installation at the data center,
wherein the infrastructure distribution system is configured to:
coordinate with the load tracking module such that the additional rack computer systems and the additional infrastructure modules arrive at the data center at proximate times.

\* \* \* \* \*